US012718872B2

(12) United States Patent
Chiu et al.

(10) Patent No.: US 12,718,872 B2
(45) Date of Patent: Aug. 25, 2026

(54) SRAM STRUCTURE WITH ASYMMETRIC INTERCONNECTION

(71) Applicant: Taiwan Semiconductor Manufacturing Company, Ltd., Hsin-Chu (TW)

(72) Inventors: Yi-Hsun Chiu, Hsinchu County (TW); Chia-En Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 149 days.

(21) Appl. No.: 18/672,090

(22) Filed: May 23, 2024

(65) Prior Publication Data

US 2024/0321345 A1 Sep. 26, 2024

Related U.S. Application Data

(63) Continuation of application No. 18/062,172, filed on Dec. 6, 2022, now Pat. No. 11,996,140, which is a continuation of application No. 17/186,322, filed on Feb. 26, 2021, now Pat. No. 11,521,676.

(60) Provisional application No. 63/017,768, filed on Apr. 30, 2020.

(51) Int. Cl.

| | |
|---|---|
| ***G11C 11/417*** | (2006.01) |
| ***G11C 11/412*** | (2006.01) |
| ***H10B 10/00*** | (2023.01) |

(52) U.S. Cl.

CPC .......... *G11C 11/412* (2013.01); *G11C 11/417* (2013.01); *H10B 10/12* (2023.02)

(58) Field of Classification Search

CPC . G11C 11/412; G11C 11/417; H01L 27/1104; H01L 27/0207; H01L 29/785; H01L 23/5286

USPC .................................................. 365/154, 205

See application file for complete search history.

(56) References Cited

U.S. PATENT DOCUMENTS

| | | | |
|---|---|---|---|
| 5,703,392 | A | 12/1997 | Guo et al. |
| 5,965,922 | A | 10/1999 | Matsui et al. |
| 6,620,659 | B2 | 9/2003 | Emmma et al. |
| 8,605,523 | B2 | 12/2013 | Tao et al. |
| 8,630,132 | B2 | 1/2014 | Cheng |
| 8,760,948 | B2 | 6/2014 | Tao et al. |
| 8,908,421 | B2 | 12/2014 | Liaw |
| 8,929,160 | B2 | 1/2015 | Katoch et al. |
| 8,964,492 | B2 | 2/2015 | Hsu et al. |

(Continued)

FOREIGN PATENT DOCUMENTS

| | | | |
|---|---|---|---|
| CN | 102298963 | A | 12/2011 |
| CN | 103733262 | A | 4/2014 |

(Continued)

*Primary Examiner* — Michael T Tran

(74) *Attorney, Agent, or Firm* — HAYNES AND BOONE, LLP

(57) ABSTRACT

A semiconductor structure includes a substrate having a frontside and a backside; a static random-access memory (SRAM) circuit having SRAM bit cells formed on the frontside of the substrate, wherein each of the SRAM bit cells including two inverters cross-coupled together, and a first and second pass gates coupled to the two inverters; a first bit-line disposed on the frontside of the substrate and connected to the first pass gate; and a second bit-line disposed on the backside of the substrate and connected to the second pass gate.

20 Claims, 18 Drawing Sheets

(56) References Cited

U.S. PATENT DOCUMENTS 8,982,643 B2 3/2015 Lum
9,117,510 B2 8/2015 Yang et al.
9,135,977 B2 9/2015 Kapoor et al.
9,269,424 B2 2/2016 Kim et al.
9,324,413 B2 4/2016 Ko et al.
9,570,156 B1 2/2017 Braceras et al.
9,799,660 B1 10/2017 Wong et al.
10,068,909 B1 9/2018 Tseng et al.
10,170,484 B1 1/2019 Sung et al.
10,971,505 B1 4/2021 Chang et al.
2003/0230815 A1 12/2003 Nii
2004/0036088 A1 2/2004 Tsukamoto et al.
2004/0099885 A1 5/2004 Yeo et al.
2005/0194672 A1 9/2005 Gibson et al.
2006/0023553 A1 2/2006 Takeyama et al.
2006/0171195 A1 8/2006 Nii
2008/0225590 A1 9/2008 Lamorey
2009/0014798 A1 1/2009 Zhu et al.
2011/0170337 A1 7/2011 Berthold et al.
2012/0153492 A1 6/2012 Bachman et al.
2013/0026580 A1 1/2013 Morimoto et al.
2015/0171091 A1 6/2015 Lytle
2015/0333131 A1 11/2015 Mojumder et al.
2018/0219015 A1 8/2018 Nelson et al.
2019/0147928 A1 5/2019 Liaw
2019/0259699 A1 8/2019 Morrow et al.
2019/0267052 A1 8/2019 Hu et al.
2020/0111798 A1 4/2020 Paul et al.
2020/0161413 A1 5/2020 Kirkman
2020/0211975 A1 7/2020 Dhakal et al.
2020/0212052 A1 7/2020 Lin et al.
2020/0294998 A1 9/2020 Lilak et al.
2020/0303344 A1 9/2020 Manipatruni et al.
2020/0357752 A1 11/2020 Yazzie et al.
2021/0118847 A1 4/2021 Chuang et al.
2021/0202472 A1 7/2021 Thomson et al.
2021/0305262 A1* 9/2021 Wang .................... H10D 62/121
2022/0037337 A1* 2/2022 Wang ...................... H10D 89/10
2022/0102535 A1* 3/2022 Wang .................. H01L 23/5286
2023/0067715 A1* 3/2023 Yuh .................... H10D 30/6729
2023/0144565 A1* 5/2023 Steudel ................. G11C 11/412
365/207
2023/0260569 A1* 8/2023 Fujiwara ............... G06F 7/5443
2023/0274769 A1* 8/2023 Akkaya .................. H10B 10/12
2023/0317146 A1 10/2023 Sharma et al.
2023/0317150 A1 10/2023 Jung et al.
2023/0345693 A1 10/2023 Wang et al.
2023/0354570 A1 11/2023 Hwang et al.
2023/0389260 A1* 11/2023 Liaw ..................... G11C 11/413
2024/0194253 A1* 6/2024 Parvarandeh ......... G11C 11/419
2024/0257840 A1* 8/2024 Chung ................... G11C 5/063
2024/0257867 A1* 8/2024 You ....................... G11C 11/412
2024/0282364 A1* 8/2024 You ........................ H03K 19/20
2024/0395316 A1* 11/2024 Lin ....................... G11C 11/417

FOREIGN PATENT DOCUMENTS

CN 103915112 A 7/2014
CN 104752337 A 7/2015
CN 106898598 A 6/2017
CN 110970437 A 4/2020
CN 116343862 A 6/2023
TW 201822343 A 6/2018
TW 202145536 A * 12/2021 ........... G11C 11/412
WO WO-2019066801 A1 4/2019

* cited by examiner 100
604
610
604
610
604
610
604
610
602
606
608
612
606
608
614
616
612
606
604
610
604
610
604
610
604
610

Y
Z 100
310
A'
A
620
722A2
714B2
104B
714A2
724B
714C2
714D2
722B
104A
714C
714A
722A
714B
714D
X
Y

Frontside
Backside
MD
VB
BL
Device
Vss
BCT
Vdd
722B2
714D2
WL
BLB
Far
704
702
706
Z

800

Receive an circuit design layout of an integrated circuit having a plurality of SRAM cells 802

Identify contacts associated with various word lines, bit lines and power lines 804

Group the contact features into a first and second group according to various parameters and design rules 806

Modify the circuit design layout such that the contacts of the second group are configured on the backside of the substrate 808

810

Fabricate an integrated circuit according to the modified circuit design layout 812

Contact spacing 820

Shielding effect 822

Parasitic capacitance (RC constant) 824

Voltage level 826

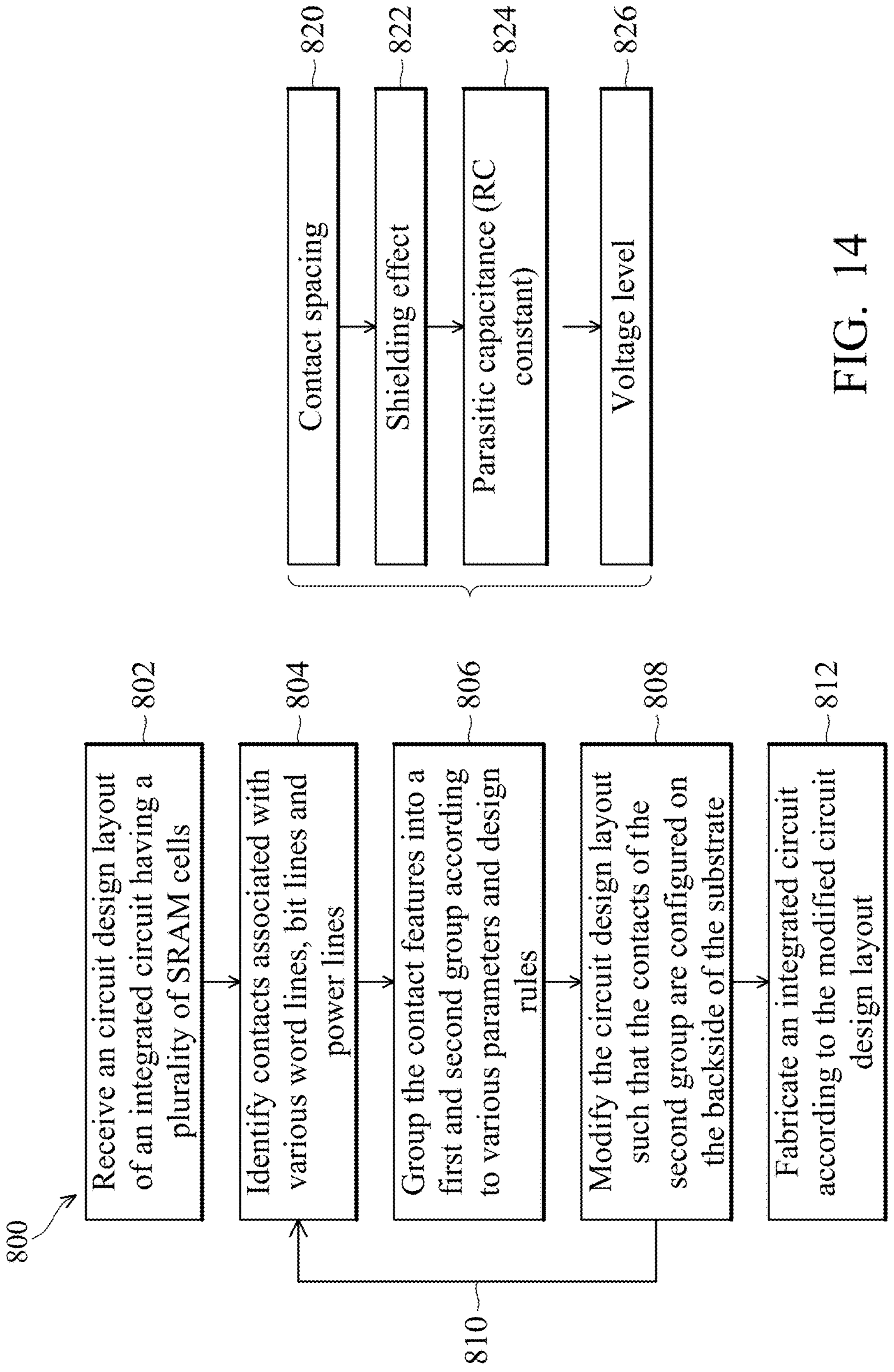

FIG. 14

SRAM STRUCTURE WITH ASYMMETRIC INTERCONNECTION

PRIORITY DATA

This is a continuation application of U.S. application Ser. No. 18/062,172, filed Dec. 6, 2022 (issued as U.S. Pat. No. 11,996,140), which is a continuation application of U.S. application Ser. No. 17/186,322, filed Feb. 26, 2021 (issued as U.S. Pat. No. 11,521,676), which further claims priority to U.S. Provisional Patent Application Ser. No. 63/017,768, filed Apr. 30, 2020, each of which is herein incorporated by reference in its entirety.

BACKGROUND

An integrated circuit includes various circuits with respective functions, such as a memory circuit having a plurality of memory bit cells to retain information. The memory circuit includes non-volatile devices or volatile devices. For example, the volatile devices include static-random-access memory (SRAM) devices. Three dimensional transistors with fin-type active regions are often desired for enhanced device performance. Those three-dimensional field effect transistors (FETs) formed on fin-type active regions are also referred to as FinFETs. Other three-dimensional field-effect transistors include gate-all-around FETs. These FETs are required to have narrow fin width for short channel control, which leads to smaller source/drain regions than those of planar FETs. This will reduce the alignment margins and cause issues for further shrunken device pitches and increasing packing density. Furthermore, when metal interconnect is continuously scaling down to less feature sizes for circuit routing density improvement, the existing interconnect structure schemes face various issues in tighter pitch metal layers. For example, there is metal filling problems due to metal lines or plugs require diffusion barrier metal layer for reliability consideration and the barrier layer further reduce the sizes of the metal lines and metal plugs. These barrier metal layers will impact the trench filling capability and therefore, result in metal resistance degradation or even worse, such as via opening or electro-migration (EM) concern. Other issues with the scaling down of the device sizes include increased routing resistance, increased parasitic capacitance, shorting, leakage, alignment margins, layout flexibility, and packing density. Therefore, there is a need for a structure and method for SRAM structures and method making the same to address these concerns with enhanced circuit performance and reliability, and increased packing density.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 14 is a flowchart of a method of generating an asymmetric layout of an integrated circuit having a plurality of SRAM cells, constructed in accordance with some embodiments.

DETAILED DESCRIPTION

Figure 1:
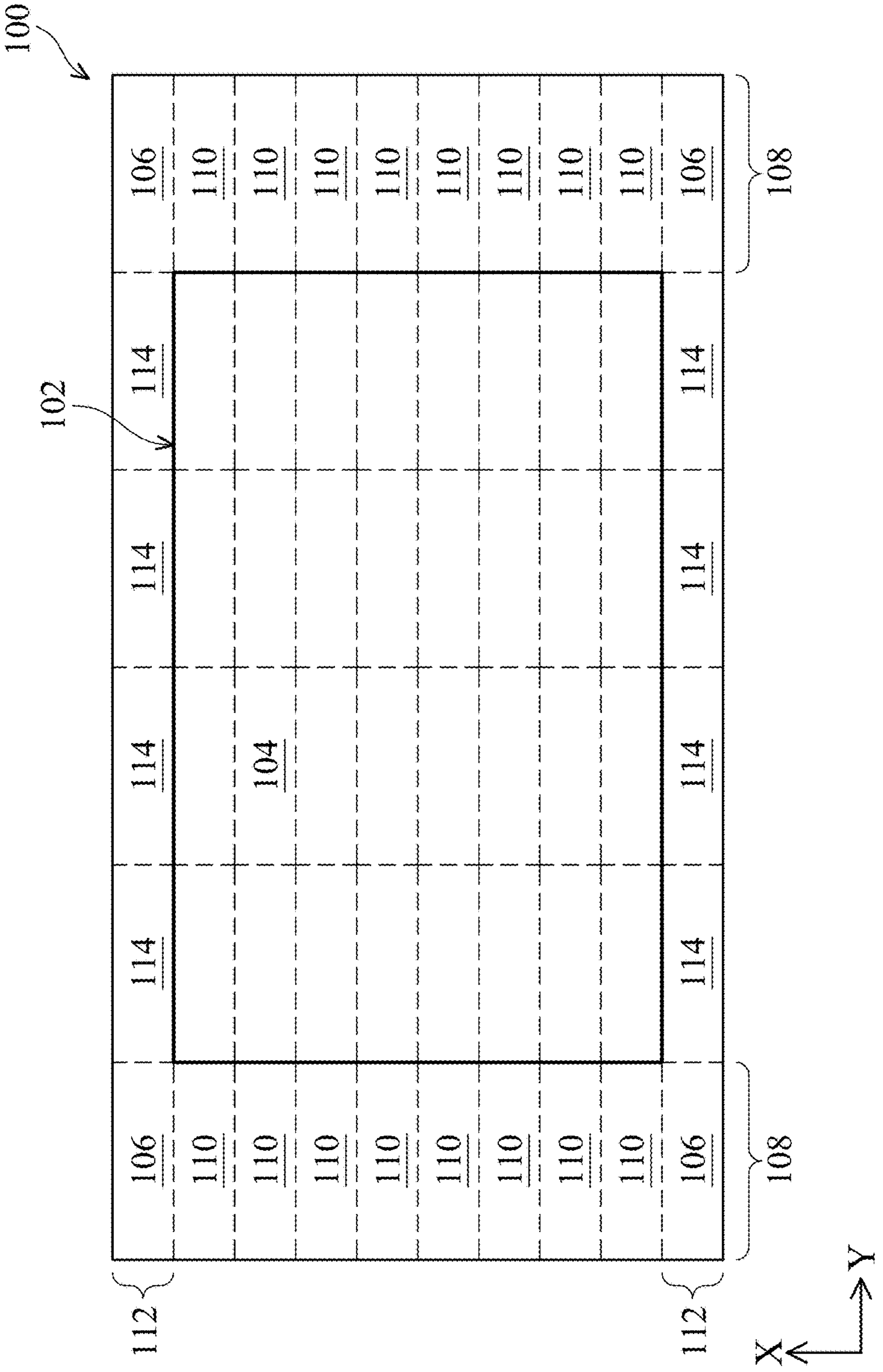
FIG. 1 is a top view of an integrated circuit having static random-access memory (SRAM) devices, constructed according to various aspects of the present disclosure in some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure provides various embodiments of a static-random-access memory (SRAM) device structure and a method making the same. Particularly, the present disclosure provides various embodiments of the SRAM device structure with power lines (such as higher power lines $V_{dd}$ and lower power lines $V_{ss}$), bit lines and word lines distributed on the frontside and backside of the substrate such that the overall device performance is enhance among various trade-off parameters, such as metal routing resistance and parasitic capacitance.

FIG. 1 is a top view of an integrated circuit (IC) structure 100 constructed according to various aspects of the present disclosure in one embodiment. In some embodiments, the integrated circuit structure 100 is formed on flat active regions and includes field-effect transistors (FETs). In some embodiments, the integrated circuit 100 is formed on fin active regions and includes fin field-effect transistors (FinFETs). In some embodiments, the integrated circuit structure 100 includes other three-dimensional active regions, such as multiple channels vertically stacked on the substrate. The corresponding FET has a gate stack around the multiple channels vertically stacks, therefore also being referred to as gate-all-around FET structure. The integrated circuit structure 100 includes a static-random-access memory (SRAM) circuit having a SRAM array 102 of a plurality of SRAM bit cells (or SRAM cells) 104 configured in an array, spanning into multiple columns along and multiple rows. The integrated circuit structure 100 may further include other devices/circuit modules (such as logic devices, high-frequency devices, image-sensing devices, dynamic-random-access memory (DRAM) devices or a combination thereof) integrated with the SRAM devices. In the present embodiments, each column of the SRAM bit cells 104 in the array spans along the X direction and each row spans along the Y direction. For examples, each column may include N1 SRAM bit cells configured in a line (a column) along the X direction, and each row may include N2 SRAM bit cells configured in a line (a row) along the Y direction. In other words, the SRAM array 102 includes SRAM bit cells configured in N1 rows and N2 column. In some examples of the SRAM array 102, each column includes 8, 16, 32, 64 or 128 SRAM bit cells, and each row may include 4, 8, 16, or 32 SRAM bit cells. In the example illustrated in FIG. 1, the SRAM array 102 includes 4 columns and 8 rows.

The integrated circuit 100 further includes corner dummy cells 106 disposed on four corners of the SRAM array 102 and edge straps, such as word-line edge straps (WL edge straps) 108 disposed on raw edges of the SRAM array 102 and bit-line edge straps (BL edge straps) 112 disposed on column edges of the SRAM array 102. Each WL edge strap 108 includes a plurality of WL edge cells 110 configured in a line along X direction and each BL edge strap 112 includes a plurality of BL edge cells 114 configured in a line along Y direction. Those edge straps (108 and 110) are circuit regions not designed to serve as SRAM bit cells but to provide other functions as described later.

Each SRAM bit cell 104 includes two inverters cross-coupled together to store a bit of data and further includes a pass gate electrically connected to the two inverters for reading from and write into the SRAM bit cell. The SRAM bit cell 104 is further illustrated in FIG. 2 in a schematic view, constructed in accordance with some embodiments. The SRAM bit cell 104 includes a first pull-up device ("PU-1") and a first pull-down device ("PD-1") connected into a first inverter. The SRAM bit cell 104 further includes a second pull-up device ("PU-2") and a second pull-down device ("PD-2") connected into a second inverter. The first and second inverters are cross-coupled to form a data storage unit. The SRAM bit cell 104 further includes a pass gate electrically connected to the two inverters for data reading and writing. In the present embodiment, the SRAM bit cell 104 includes a dual port SRAM device having two pass gates ("PG-1" and "PG-2"). The SRAM bit cell 104 include field-effect transistors (FETs) to form pass gate(s) and the inverters. In the present embodiment, each of the pass gate devices (PG-1 and PG-2) includes an n-type FET; each of the pull-down devices (PD-1 and PD-2) includes a n-type FET; and each of the pull-up devices (PU-1 and PU-2) includes a p-type FET. The pull-down devices, the pull-up devices and the pass gates each may include more than one corresponding FET or different number of FETS to tune the SRAM bit cell performance, such as sink current, access speed, and/or device reliability. For example, the number of FETs in the pull-down devices is greater than the number of FETs in the pass-gate devices. In some embodiments, those additional pull-down devices may be formed in additional fin active regions. Alternatively, the SRAM bit cell 104 is formed on the multiple channels vertically stacked but the pull-down devices of the SRAM bit cell 104 are formed on the vertically-stacked channels with a greater number of channels than those for pass-gate devices or pull-up devices.

Specifically, the drains of the first pull-up device (PU-1) and the first pull-down device (PD-1) are electrically connected together, defining a first drain node (or first node) 202. The drains of the second pull-up device (PU-2) and the second pull-down device (PD-2) are electrically connected together, defining a second drain node (or second node) 204. The gates of PU-1 and PD-1 are electrically connected together and coupled to the second node 204. The gates of PU-2 and PD-2 are electrically connected together and coupled to the first node 202. The sources of PU-1 and PU-2 are electrically connected to the power line (Vdd line). The sources of PD-1 and PD-2 are electrically connected to a complementary power line (Vss line).

Figure 2:
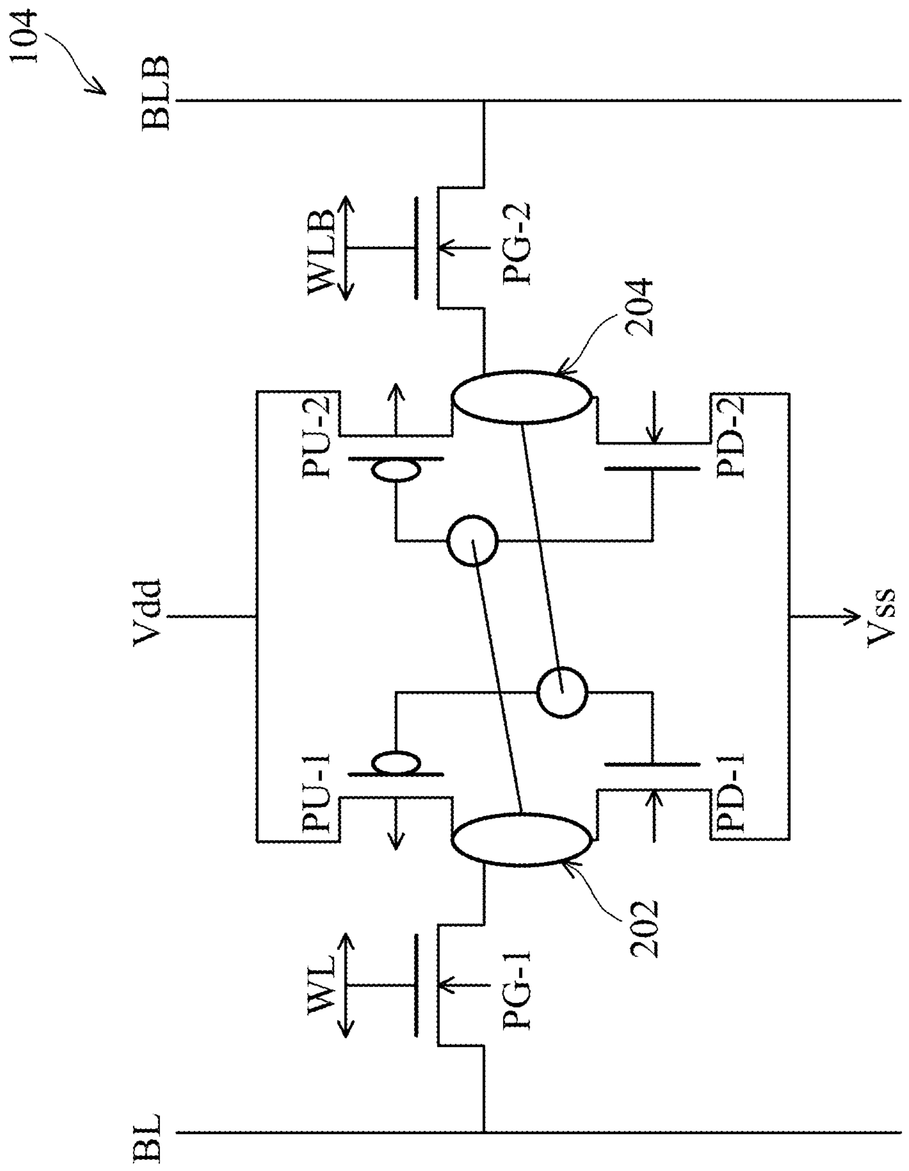
FIG. 2 is a schematic view of a SRAM bit cell in the integrated circuit of FIG. 1, in accordance with some embodiments.

Still referring to FIG. 2, the SRAM bit cell 104 includes dual ports: a first port associated with the first pass gate (PG-1) and a second port associated with the second pass gate (PG-2). The pass-gate devices each includes a n-type FET. In some embodiments, each pass gate may include more than one FET as noted above. The drain of PG-1 is electrically connected to a bit-line ("BL"). The source of PG-1 is electrically connected to the first node 202. The gate of PG-1 is electrically connected to a word-line ("WL"). The drain of PG-2 is electrically connected to a complementary bit-line or bit-line bar ("BLB"). The source of PG-2 is electrically connected to the second node 204. The gate of PG-2 is electrically connected to a complementary word-line or word-line bar ("WLB"). Various nFETs and pFETs may be formed by any proper technology, such as fin-like FETs (FinFETs) that includes n-type FinFETs (nFinFETs) and p-type FinFETs (pFinFETs). In one embodiment, the various nFinFETs and pFinFETs are formed by a process including etching a semiconductor to form trenches, partially filling (such as by a procedure that includes deposition, chemical mechanical polishing and etching to recess) the trenches to form shallow trench isolation (STI) features and fin active regions. In furtherance of the present embodiment, an epitaxy semiconductor layer is selectively formed on the fin active region. In another embodiment, the various FinFETs are formed by a process including depositing a dielectric material layer on the semiconductor substrate, etching the dielectric material layer to form openings thereof, selective epitaxy growing a semiconductor material (such as silicon) on the semiconductor substrate within the openings to form fin active regions and STI features. In another embodiment, the various FinFETs may include strained features for enhanced mobility and device performance. For example, the pFinFETs may include epitaxy grown silicon germanium on a silicon substrate. The nFinFETs may include epitaxy grown silicon carbide on the silicon substrate. In another embodiment, the gate stacks in various FinFETs are formed using high k/metal gate technology, in which the gate dielectric layer includes a high-k dielectric material and the gate electrode includes metal.

Figure 3:
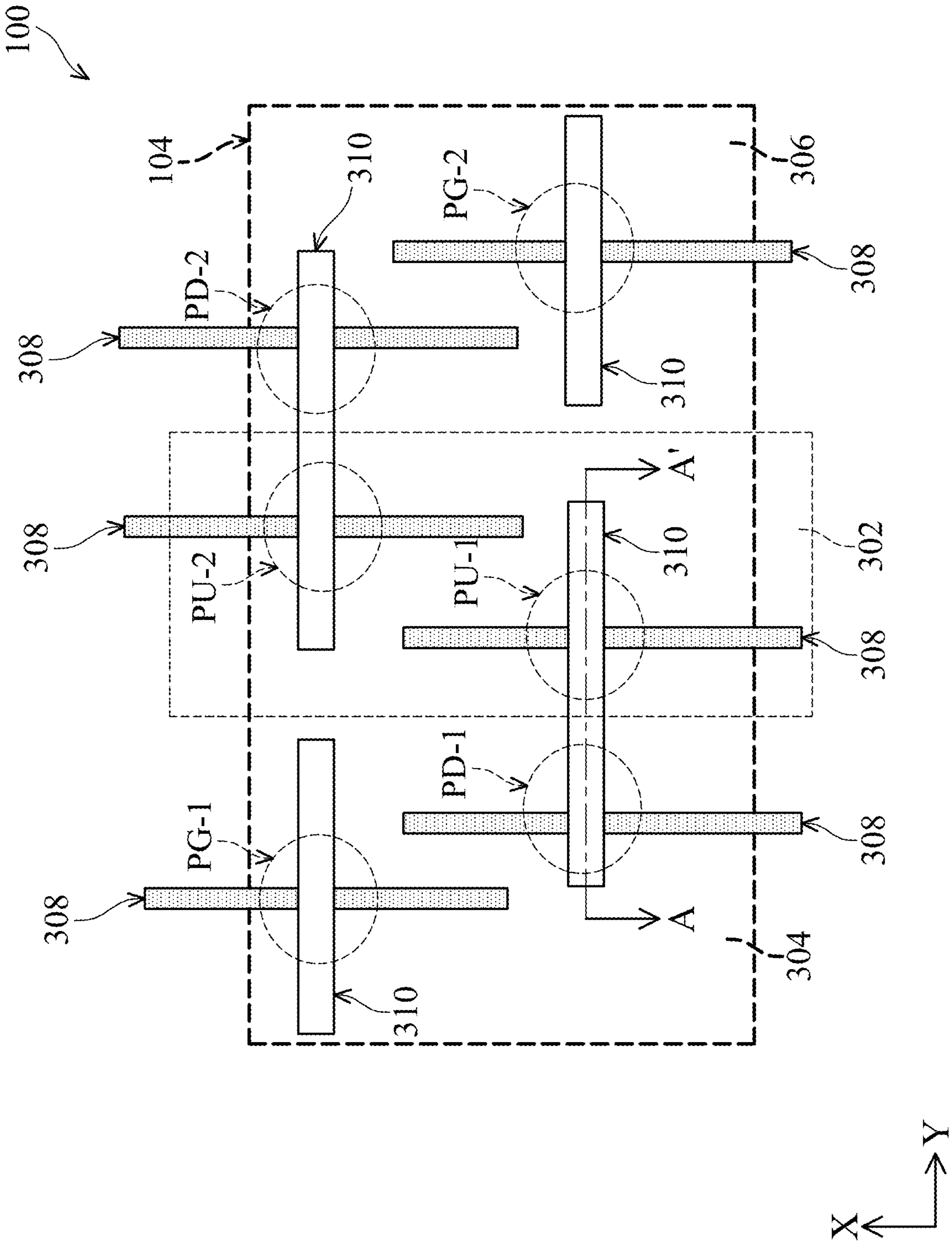
FIG. 3 is a top view of a SRAM bit cell in the integrated circuit of FIG. 1, in accordance with some embodiments.

FIG. 3 is a top view of the integrated circuit 100 in portion, particularly a SRAM bit cell 104, constructed in accordance with some embodiments. As illustrated in FIG. 3, the integrated circuit 100 includes a n-type doped well (n-well) 302 formed in the center of the SRAM bit cell 104. The n-well 302 may have an elongated shape oriented in the X direction and may extend along the X direction over multiple SRAM bit cells. The integrated circuit 100 includes a first p-type doped well (p-well) 304 and a second p-well 306 formed in sides of the n-well 302, each with elongated shape oriented in the X direction. The p-wells 304 and 306 may extends along the X direction over multiple SRAM bit cells as well. The integrated circuit 100 includes various active regions 308 disposed in the respective doped wells (such as 302, 304 and 306) with various FETs formed thereon. Those active regions 308 are surrounded and defined by isolation features, such as STI features. In some embodiments, the active regions 308 are fin-like active regions extended above the isolation features (such as STI features). In some embodiments, the fin-like active regions 308 have elongated shapes oriented in the X direction and may extend over multiple SRAM bit cells. The gates 310 of the FETs are formed on the active regions 308 and oriented along the Y direction. Especially, some gates 310 extend from the n-well 302 to the adjacent p-well (such as 304 or 306) such that corresponding FETs (such as PU-1 and PD-1, or PU-2 and PD-2) share a common gate. In the present embodiment, the gate 310 over both n-well 302 and p-well 304 is associated with a pFET for the first pull-up device (PU-1) in the n-well 302 and an nFET for the first pull-down device (PD-1) in the p-well 304; the gate 310 over both n-well 302 and p-well 306 is associated with a pFET for the second pull-up device (PU-2) in the n-well 302 and an nFET for the second pull-down device (PD-2) in the p-well 306; the nFET for the first pass gate (PG-1) is formed in the p-well 304; and the nFET for the second pass gate (PG-2) is formed in the p-well 306.

Figure 4A:
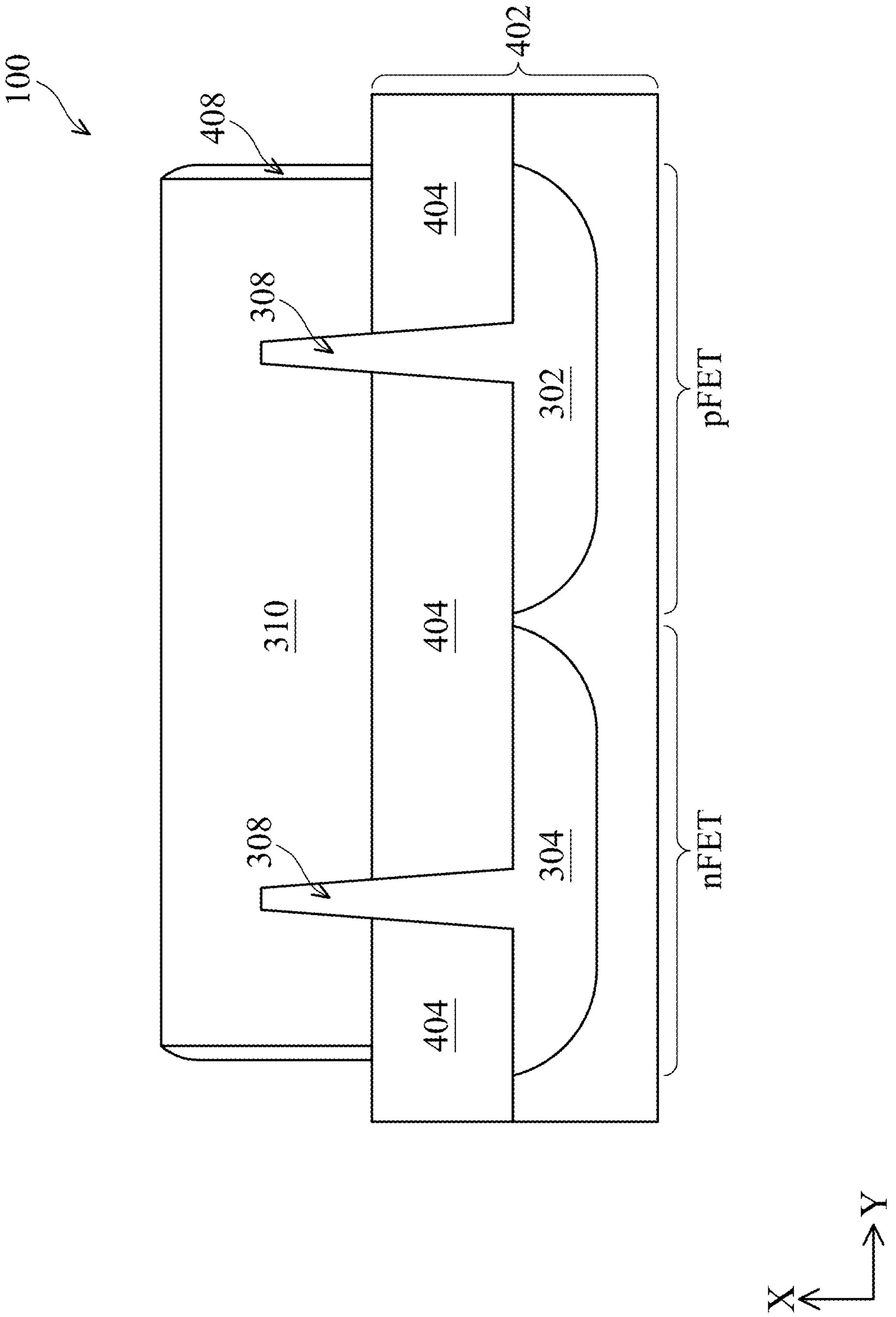
FIG. 4A is a sectional view of the SRAM bit cell of FIG. 3 along the dashed line AA', in portion, in accordance with some embodiments.
Figure 4B:
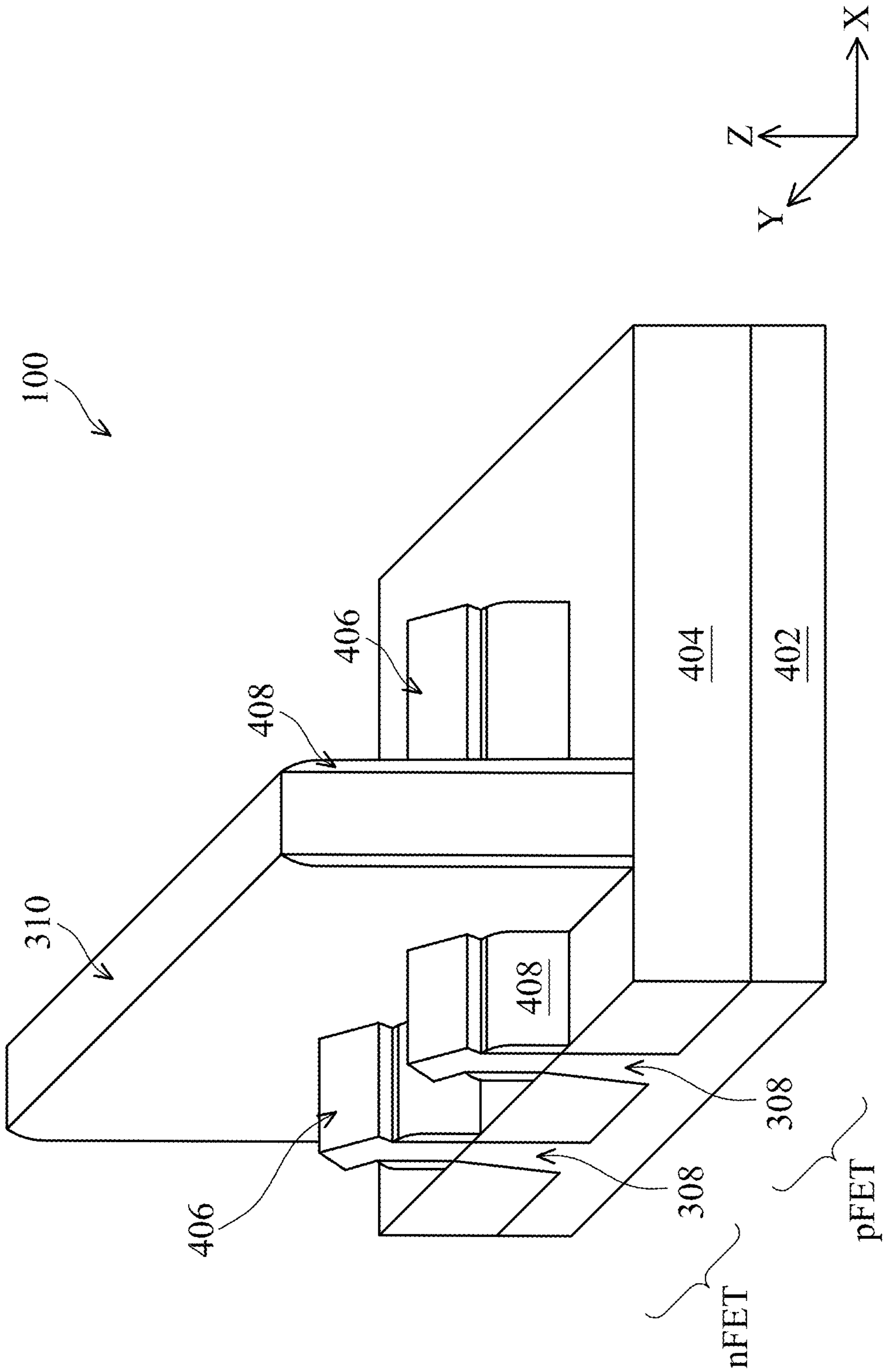
FIG. 4B is a perspective view of the SRAM bit cell of FIG. 4A, in accordance with some embodiments.

FIG. 4A is a sectional view of the integrated circuit 100, in portion, such as along the dashed line AA' of FIG. 3, constructed in accordance with some embodiments. FIG. 4B is a perspective view of the integrated circuit 100 of FIG. 4A, constructed in accordance with some embodiments. In FIGS. 4A and 4B, the integrated circuit 100 includes a semiconductor substrate 402. The semiconductor substrate 402 includes silicon. Alternatively, the semiconductor substrate 402 includes germanium, silicon germanium or other proper semiconductor materials. The integrated circuit 100 includes various isolation features 404, such as shallow trench isolation (STI) features. The integrated circuit 100 also includes various active regions 308, such as fin active regions, formed on the semiconductor substrate 402. In the illustrated embodiment where the active regions 308 are fin-like, the active regions 308 are extruded above the isolation features 404 and are surrounded and isolated from each other by the isolation features 404. The integrated circuit 100 also includes a p-well 304 and an n-well 302 formed on the semiconductor substrate 402. Various FETs are formed on the active regions 308. A nFET is disposed on the active regions 308 within the p-well 304 and a pFET is disposed on the active regions 308 within the n-well 302.

Sources and drains (S/D) 406 are formed on the active regions 308, and a gate 310 is formed on the active region 308 and disposed between the corresponding source and drain 406. In the present example, the gate 310 extends over from the first active region within the p-well 304 to the second active region within the n-well 302, therefore as a common gate shared by the corresponding nFET and pFET. The gate 310 includes a gate dielectric layer and a gate electrode disposed on the gate dielectric layer. Dielectric spacers 408 may be further formed on sidewalls of the gate 310 and sidewalls of the active regions 308 as well. A channel is a portion of the active region 308 underlying the corresponding gate 310. The corresponding source and drain 406; the gate 310; and the channel are coupled to a field effect transistor, such as a nFET or a pFET.

In various embodiments, the isolation features 404 utilize a proper isolation technology, such as local oxidation of silicon (LOCOS) and/or shallow trench isolation (STI), to define and electrically isolate the various regions. The isolation feature 404 includes silicon oxide, silicon nitride, silicon oxynitride, other suitable dielectric materials, or combinations thereof. The isolation feature 404 is formed by any suitable process. As one example, forming STI features includes using a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as CMP. In some examples, the filled trench may have a multi-layer structure, such as a thermal oxide liner layer filled with silicon nitride or silicon oxide.

In another embodiment, the gates 310 alternatively or additionally include other proper materials for circuit performance and manufacturing integration. For example, the gate dielectric layer includes high k dielectric material layer, such as metal oxide, metal nitride or metal oxynitride. In various examples, the high k dielectric material layer includes metal oxide: $ZrO_2$, $Al_2O_3$, and $HfO_2$, formed by a suitable deposition method. The gate dielectric layer may further include an interfacial layer interposed between the semiconductor substrate 402 and the high k dielectric material.

The gate electrode includes metal, such as aluminum, copper, tungsten, metal silicide, doped polysilicon, other proper conductive material or a combination thereof. The gate electrode may include multiple conductive films designed such as a capping layer, a work function metal layer, a blocking layer and a filling metal layer (such as aluminum or tungsten). multiple conductive films designed for work function matching to an nFET and a pFET, respectively. In some embodiments, the gate electrode for nFET includes a work function metal with a composition designed with a work function equal 4.2 eV or less and the gate electrode for pFET includes a work function metal with a composition designed with a work function equal 5.2 eV or greater. For examples, the work function metal layer for nFET includes tantalum, titanium aluminum, titanium aluminum nitride or a combination thereof. In other example, the work function metal layer for pFET includes titanium nitride, tantalum nitride or a combination thereof.

Figure 5:
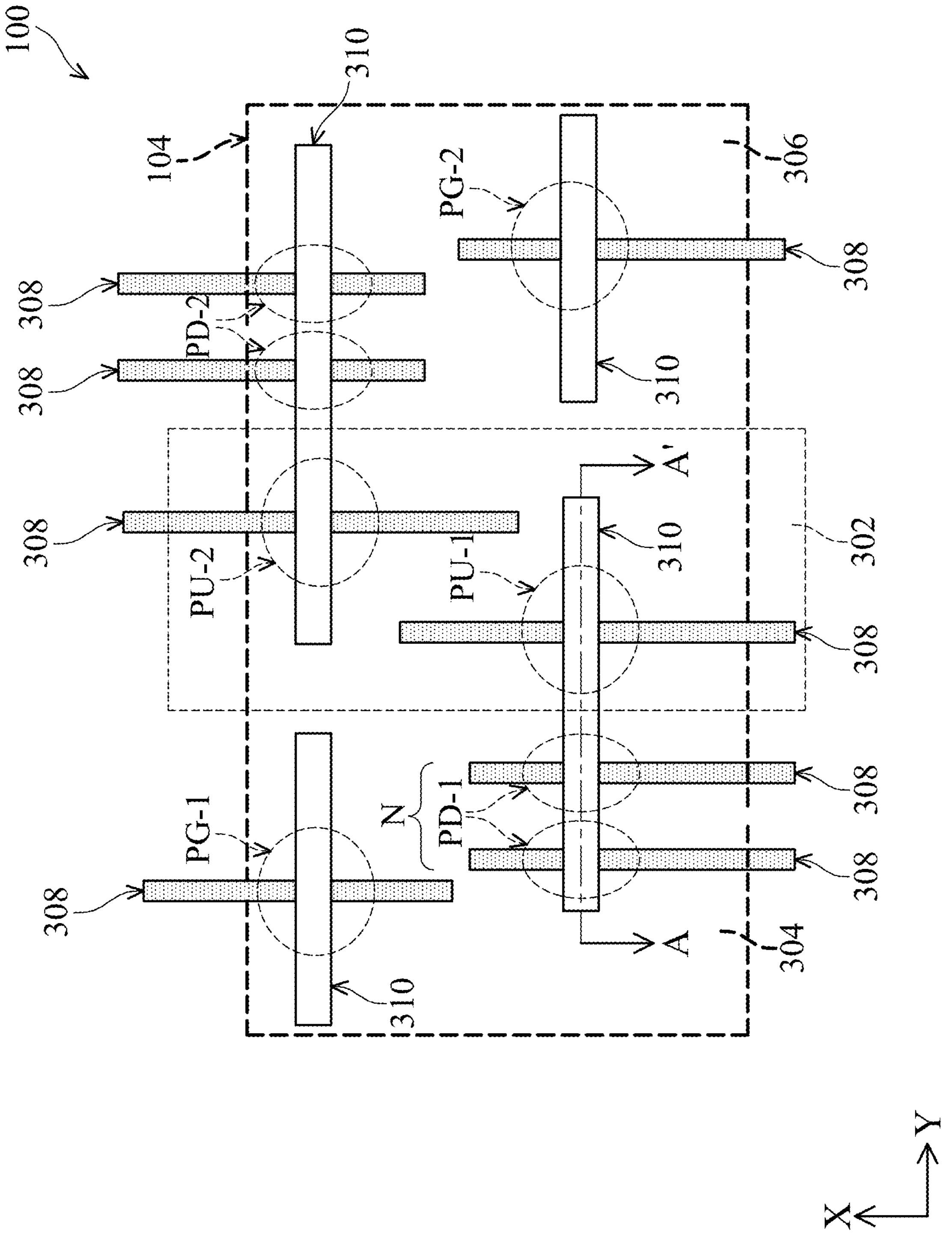
FIG. 5 is a top view of a SRAM bit cell in the integrated circuit of FIG. 1, in accordance with some embodiments.

FIG. 5 is a top view of the integrated circuit 100 in portion, particularly a SRAM bit cell 104, constructed in accordance with some embodiments. As illustrated in FIG. 5, the integrated circuit 100 includes two or more first pull-down (PD-1) devices formed on a number (N) of fin active regions 308 within the p-well 304 and two or more second pull-down (PD-2) devices formed on the number (N) of fin active regions 308 within the p-well 306. In the depicted example, the number N is 2. In other examples, the number N may be 3, 4 or etc.

Figure 6:
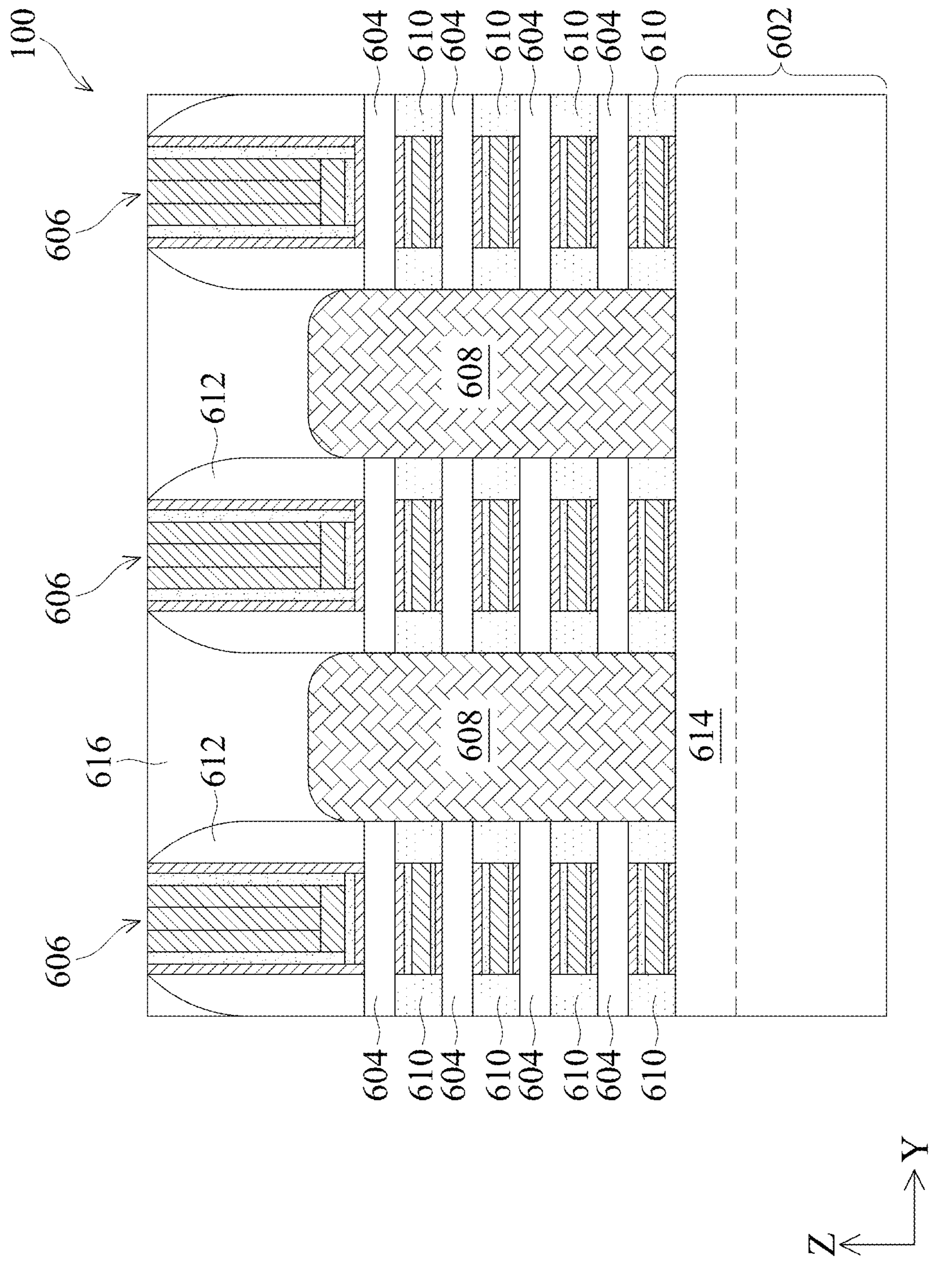
FIG. 6 is a sectional view of a SRAM bit cell in the integrated circuit of FIG. 1, in accordance with some embodiments.

FIG. 6 is a sectional view of the integrated circuit 100, in portion, constructed in accordance with some embodiments. In FIG. 6, the integrated circuit 100 has a vertically-stacked channel structure, in which multiple channels are vertically stacked. Especially, the integrated circuit 100 includes a substrate 602 and multiple channels 604 formed over the substrate 602. The integrated circuit 100 further includes a gate 606 formed around the channels 604 and source/drain (S/D) features 608 disposed on both sides of the gate 606. Particularly, the gate 606 wraps around each of the vertically-stacked multiple channels 604 that span between the S/D features 608 disposed on the both sides of the gate 606. The integrated circuit 100 further includes other features, such as inner spacers 610 (of one or more dielectric material) interposed between the gate 606 and the S/D features 608; gate spacers 612 disposed on sidewalls of the gate 606; a doped well 614 (such as an N-well or a P-well); and an interlevel dielectric (ILD) layer 616. The gate 606 includes a gate dielectric layer and a gate electrode. The gate dielectric layer includes one or more dielectric material, such as a high-k dielectric material. The gate dielectric layer may further include an interfacial layer (such as silicon oxide) underlying the high-k dielectric material. The gate electrode includes one or more conductive material, such as a capping layer, a work functional metal and a fill metal. Accordingly, the various nFETs and pFETs of the SRAM bit cell 104 are formed those vertically-stacked channels. Furthermore, the first number N1 of the channels for a pull-down device and the second number N2 of the channels for a pull-up device may be designed differently to tune the performance of a SRAM cell. For example, the ratio N1/N2 is designed to be greater than 1, such as N1/N2=2/1; 3/2; 5/3; and so on.

Figure 7:
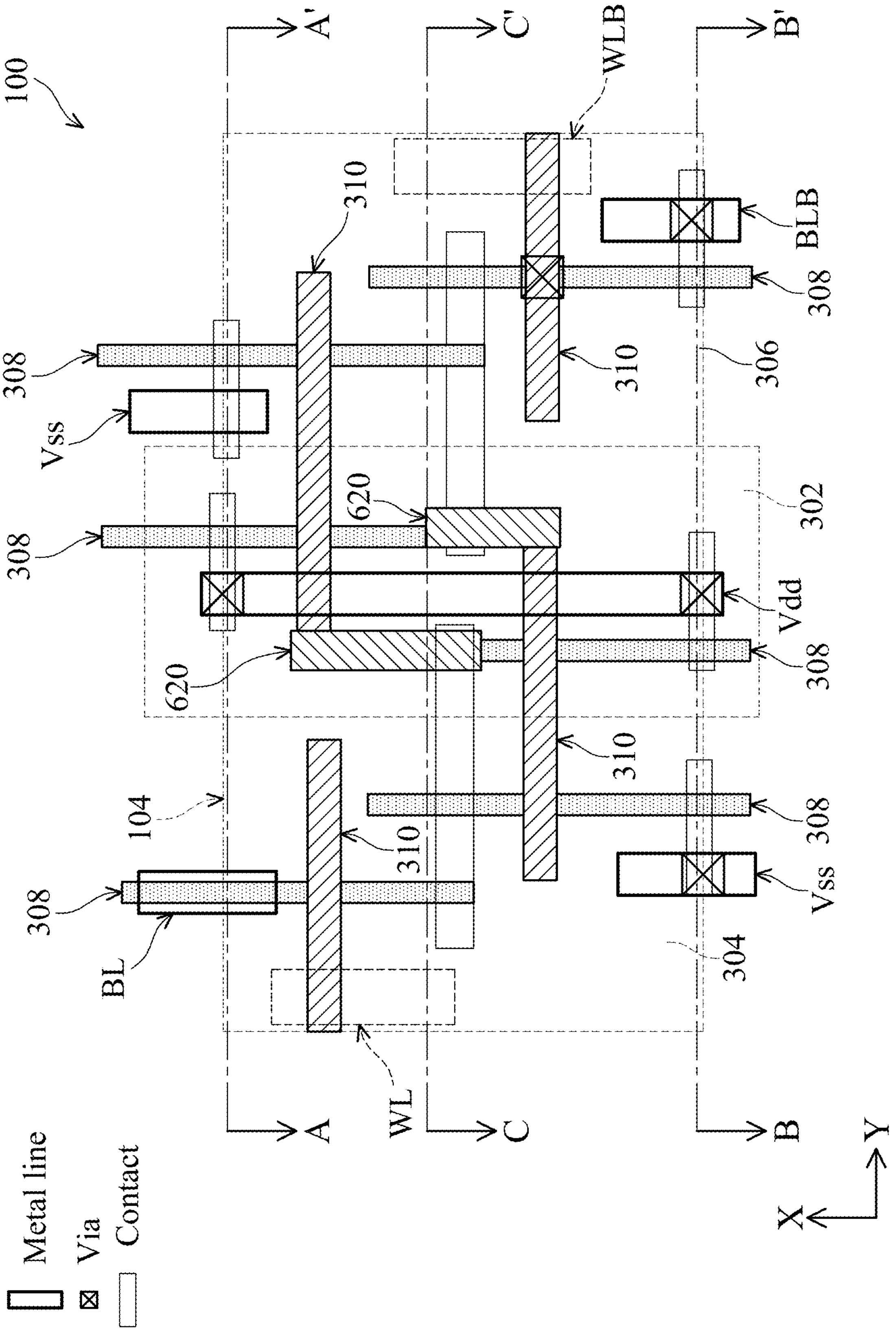
FIG. 7 is a top view of the SRAM bit cell of FIG. 3 with an interconnection structure, constructed in accordance with some embodiments.

Those FETs of the SRAM bit cell 104 are further connected to form a functional SRAM circuit. FIG. 7 is a fragmentary top view of the integrated circuit 100, in portion, constructed in accordance with some embodiments. FIG. 7 is similar to FIG. 3 but includes an interconnect structure that connects the FETs according to FIG. 2. An interconnect structure includes various conductive features, such as contacts (contact features); vias (via features) and metal lines distributed in multiple metal layers, configured to achieve the designed connections.

In FIG. 7, the sources of the PU-1 and PU-2 are connected to a first power line Vdd with a higher voltage; the sources of the PD-1 and PD-2 are connected to a second power line Vss with a lower voltage (e.g., a grounding line); the drains of the PG-1 and PG-2 are connected to a bit-line (BL) and a complementary bit-line (BLB), respectively; and the gates of the PG-1 and PG-2 are connected to a word-line (WL) and a complementary word-line (WLB), respectively. In some embodiments, only WL or WLB are shared with adjacent SRAM cells. In the present embodiment of the integrated circuit 100, each SRAM cell includes a first Vss and a second Vss, as illustrated in FIG. 7.

Those power lines (Vdd and Vss) and signal lines (BL, BLB, WL and WLB) are not all formed on the frontside of the integrated circuit structure 100 but are distributed on both the frontside and backside of the integrated circuit structure 100. Especially, the integrated circuit structure 100 includes a frontside interconnect structure and a backside interconnect structure disposed on the frontside and backside of the integrated circuit structure 100 respectively and configured to connect various components of the pull-devices, pull-down devices and pass-gate devices to form SRAM bit cells 104. The configuration is designed with considerations of various factors and parameters, including sizes of various conductive features, packing density, resistance of the conductive features, parasitic capacitances among adjacent conductive features, overlay shifting and processing margins. For example, if conductive features are too close, overlay shift may lead to short and leakage issues; the sizes of the conductive features are reduced, leading to increased resistances; the parasitic capacitances are increased as well; the processing margins are reduced; and so on. If the sizes of the conductive features are increased, the resistances of the conductive features are reduced but the spacing between the adjacent conductive features are decreased, leading to the increased parasitic capacitances, and reduced processing margins. If shielding conductive features are placed among adjacent conductive features, the parasitic capacitances are reduced. However, the packing density is reduced, and/or the resistances of the conductive features are increased.

In the depicted embodiment, one of the bit-lines (BL and BLB) and one of power lines (Vdd and Vss) are formed on the frontside, and another one of the bit-lines (BL and BLB) and another one of power lines (Vdd and Vss) are formed on the backside of the integrated circuit structure 100. In furtherance of the embodiment, the BL and the second power line (Vss) connected to the PD-2 device are formed on the backside; and the BLB and the second power line (Vss) connected to the PD-1 device, and the first power line (Vdd) connected both PU-1 and PU-2 devices are formed on the frontside. The integrated circuit structure 100 also includes butted contact 620 to landing on an active region and a gate. For example, one butted contact 620 (the left one of FIG. 7) is connected to the common gate of the PU-2 and PD-2, and the drain features of the PU-1 and PD-1. Another butted contact 620 (the right one of FIG. 7) is connected to the common gate of the PU-1 and PD-1, and the drain features of the PU-2 and PD-2. Furthermore, the word-lines (WL and WLB) may be formed on the frontside, on the backside or both. For example, one of the word-lines (WL and WLB) is formed on the frontside, and another is formed on the backside. More particularly, adjacent cells may be configured differently to properly tune routing pattern density on both the frontside and the backside. In the depicted example, WL is formed on the backside and WLB is formed on the frontside. In furtherance of the example, WL and WLB in a SRAM cell are shared with adjacent cells.

Figure 8A:
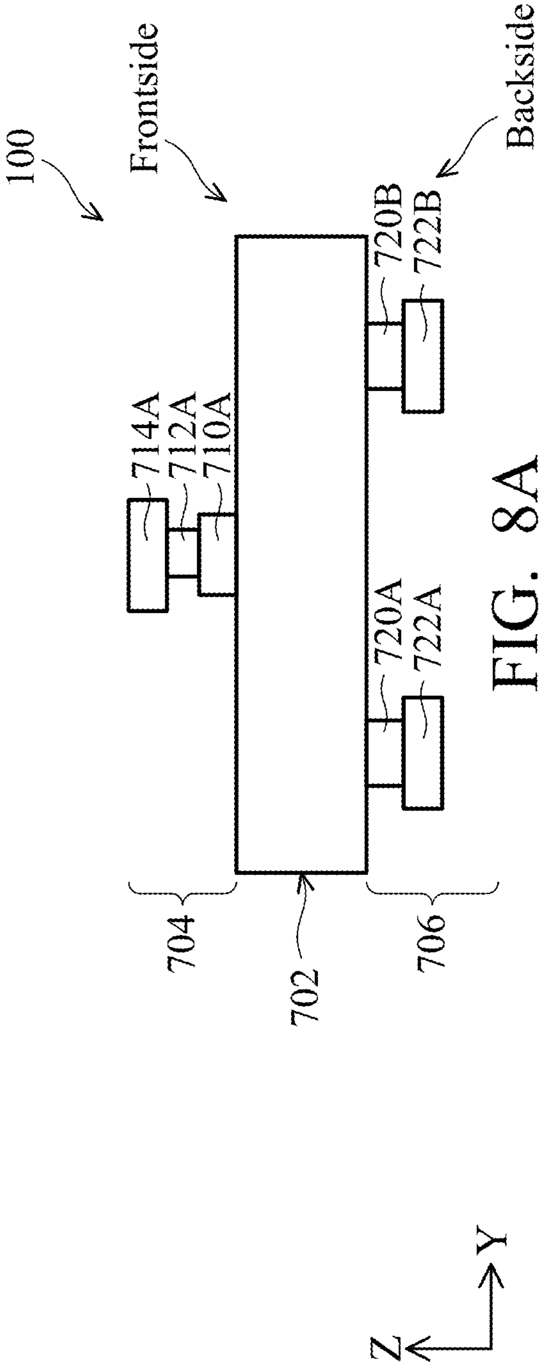
FIGS. 8A, 8B and 8C are sectional views of the SRAM bit cell of FIG. 7 along the dashed lines AA', BB' and CC', in accordance with some embodiments.
Figure 8B:
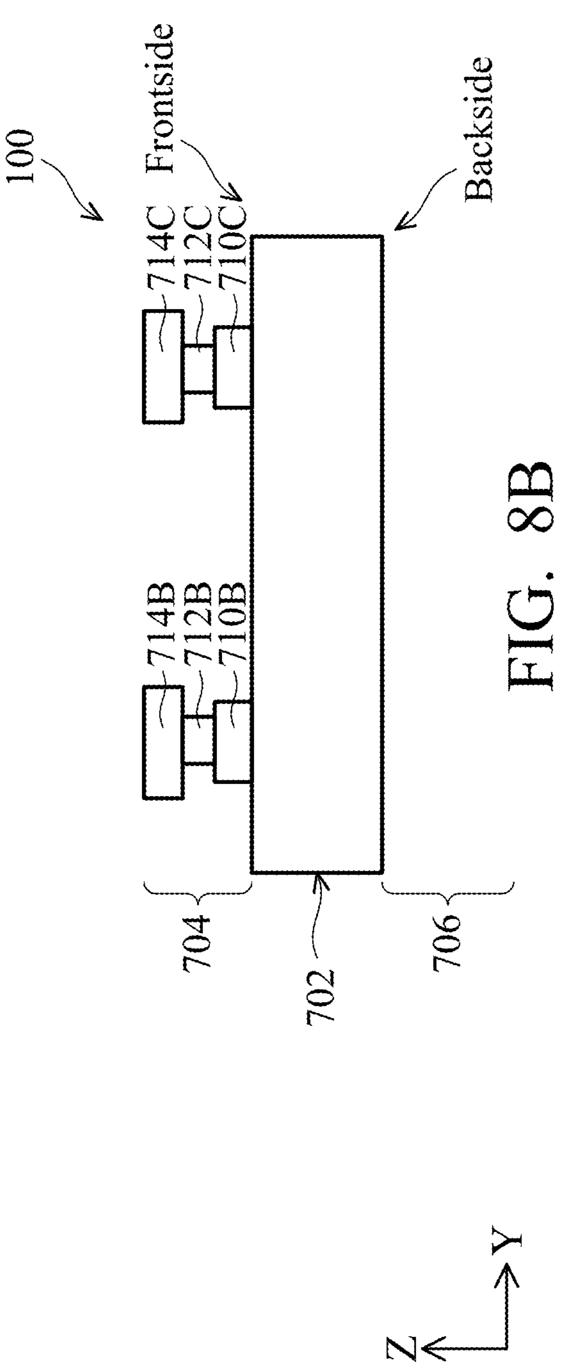
Figure 8C:
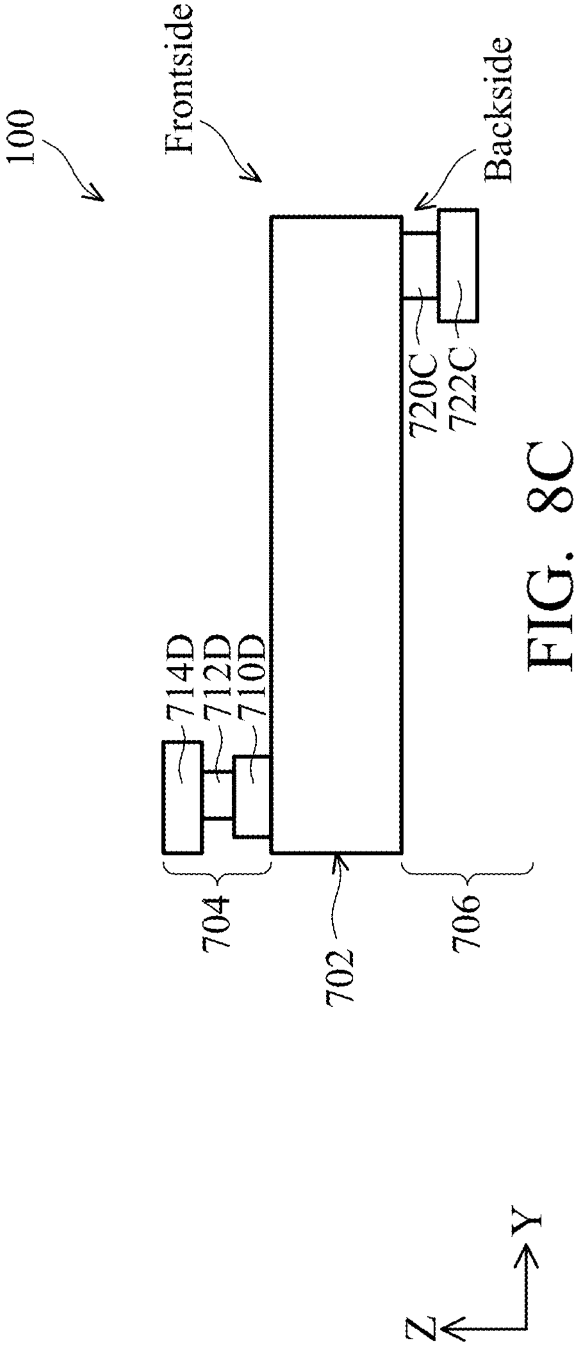

This is further illustrated in FIGS. 8A, 8B, and 8C as fragmentary sectional views of FIG. 7 along the dashed lines AA', BB', and CC', respectively. The integrated circuit structure 100 includes a substrate 702 with various devices (pull-up devices, pull-down devices and pass-gate devices) of the SRAM bit cells 104 formed thereon. The integrated circuit structure 100 further includes a frontside interconnect structure 704 formed on the frontside of the substrate 702 and a backside interconnect structure 706 formed on the backside of the substrate 702. The frontside interconnect structure 704 may include contact features 710, via features 712, and metal lines 714 distributed in multiple metal layers, such as the first metal layer closest to the substrate, the second metal layer over the first metal layer, the third metal layer over the second metal layer, and so on. Particularly, the frontside interconnect structure 704 includes contact features 710 landing on device features such as source/drain features; via features 712 landing on the contact features 710; and metal lines 714 (such as metal lines in the first metal layer) landing on the via features 712. Especially, the metal line 714A is connected down through via feature 712A and contact feature 710A to the source of the pull-up devices (PU-1 and PU-2) and connected up to the first power line (Vdd), therefore also being referred by Vdd. The metal line 714B is connected down through via feature 712B and contact feature 710B to the source of the pull-down device (PD-1) and connected up to the second power line (Vss), therefore also being referred by Vss. The metal line 714C is connected down through via feature 712C and contact feature 710C to the drain of the pass-gate device (PG-2) and connected up to the complementary bit-line (BLB), therefore also being referred by BLB. The metal line 714D is connected down through via feature 712D and contact feature 710D to the gate electrode of the pass-gate device (PG-1) and connected up to the word-line (WL), therefore also being referred by WL.

The backside interconnect structure 706 may include multiple metal layers, such as the first metal layer being closet to the substrate, the second metal layer, the third metal layer, and so on. Particularly, the backside interconnect structure 706 includes contact features (also referred as via features or backside via features) 720 landing on device features such as source/drain features; and metal lines 722 (such as metal lines of the first metal layer being closest to the substrate) landing on the via features 720. Especially, the metal line 722A is connected through via feature 720A to the drain of the pass-gate device (PG-1) as the bit-line (BL). The metal line 722B is connected through via feature 720B to the source of the pull-down device (PD-2) as the second power line (Vss). The metal line 722C is connected through via feature 720C to the gate electrode of the pass-gate device (PG-2) as the complementary word-line (WLB), therefore also being referred by WLB. Although the frontside interconnect structure 704 illustrates metal lines in one metal layer, and via features and contact features between the frontside and the metal lines, additional metal lines and additional conductive features (such as via features between adjacent metal lines) are contemplated by the present disclosure. Similarly, although the backside interconnect structure 706 illustrates metal lines in single metal layer, and via features between the backside and the metal lines, additional metal lines and other conductive features (such as contact features) are contemplated by the present disclosure.

Figure 9A:
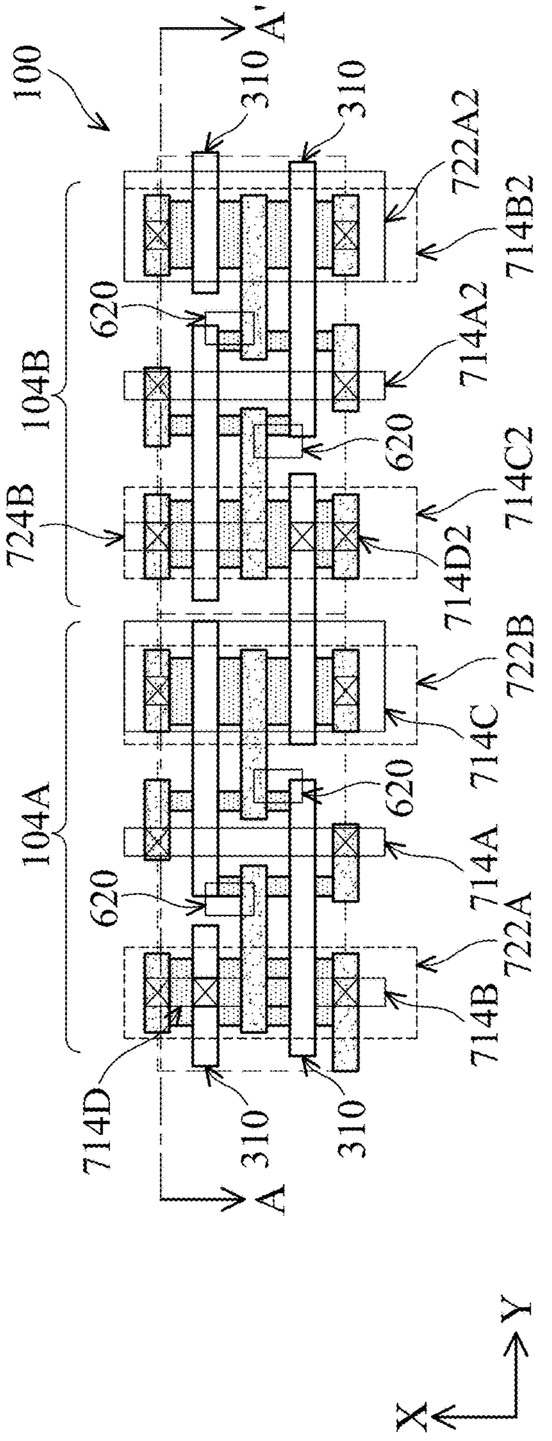
FIG. 9A is a top view of the integrated circuit structure having two adjacent SRAM bit cells, constructed in accordance with some embodiments.
Figure 9B:
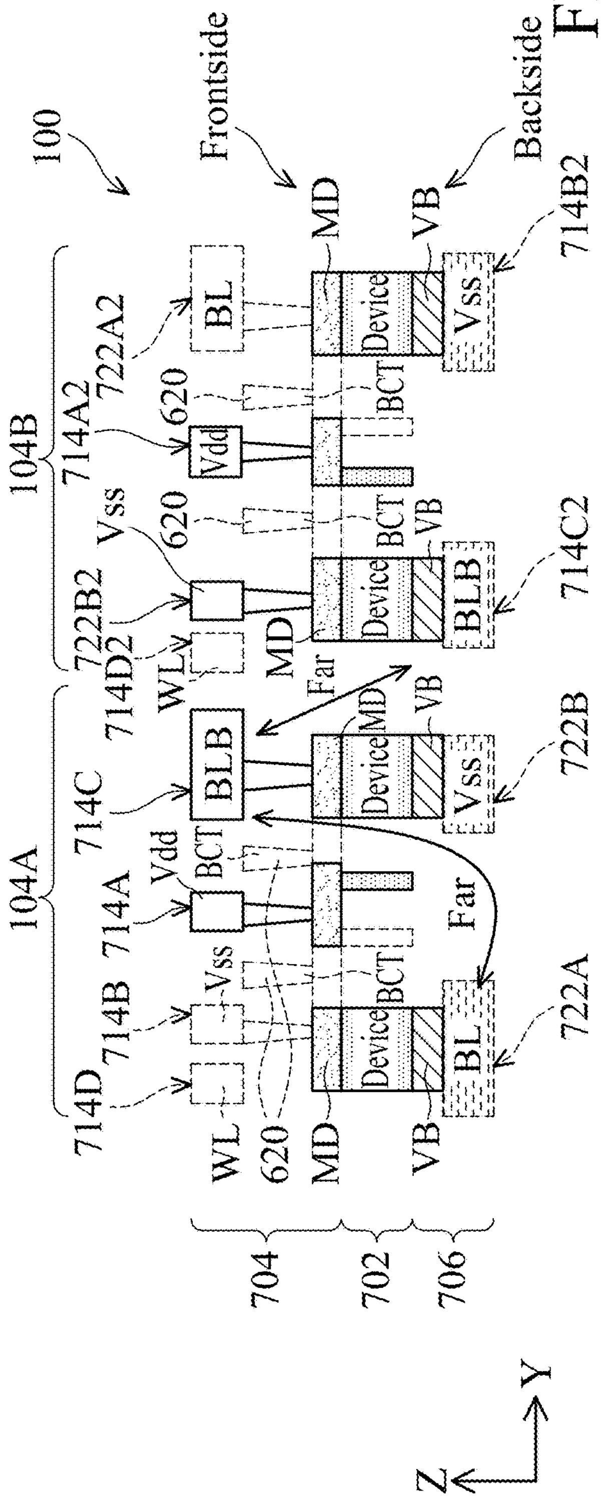
FIG. 9B is a sectional view of the integrated circuit structure of FIG. 9A along the dashed line AA', constructed in accordance with some embodiments.

In an alternative embodiment, the metal lines and corresponding contact features for the BLB and Vss associated with PD-1 are formed on the backside and the metal lines and corresponding contact features for the BL, Vss associated with PD-2, and Vdd are formed on the frontside of the substrate. In some embodiments, WL is formed on the backside and WLB is formed on the frontside, or vice versa or both formed on the frontside. In some embodiments, the cell only includes WL or has a WLB shared with an adjacent cell. Furthermore, the bit-lines of the adjacent SRAM bit cells 104 are asymmetrically configured on the frontside and backside of the substrate. For example, one SRAM bit cell is configured in a layout as FIGS. 7, 8A and 8B while the adjacent SRAM bit cell 104 is configured in a layout as described in the above alternative embodiment. The SRAM bit cells 104 in the array are similarly configured in such asymmetric layout. This is further described and illustrated in FIGS. 9A and 9B. FIG. 9A is a top view of the integrated circuit structure 100 and FIG. 9B is a sectional view of the integrated circuit structure 100 along the dashed line AA' of FIG. 9A, constructed in accordance with some embodiments. Some features are not shown in FIG. 9B for better view. Additional cells may be configured in cascade with similar asymmetric configuration.

In the depicted embodiment illustrated in FIGS. 9A and 9B, the integrated circuit structure 100 includes two SRAM bit cells 104A and 104B. Each cell includes power lines (Vss and Vdd) and bit lines (BL and BLB). Especially, the first cell 104A includes metal lines (722A and 722B) and corresponding contact features for BL and Vss (associated with PD-2), respectively, and those are formed on the backside. The first cell 104A also includes metal lines (714B, 714A, and 714C) and corresponding contact features for Vss (associated with PD-1), Vdd, and BLB, respectively, and those are formed on the frontside of the substrate. The first cell 104A also includes metal line 714D and corresponding contact feature for WL, formed on the frontside of the substrate.

The second cell 104B is designed asymmetrically in various ways including metal lines distribution between the backside and the frontside; and metal line locations, sizes and shapes. The second cell 104B includes metal lines (714C2 and 714B2) and corresponding contact features for the BLB and Vss (associated with PD-1) and the metal lines 722A2, 722B2, and 714A2 and corresponding contact features for the BL, Vss (associated with PD-2), and Vdd. However, the metals 714C2 and 714B2 for BLB and Vss (associated with PD-1 device) are formed on the backside while the metal lines 722B2, 714A2 and 722A2 for Vss (associated with PD-2 device), Vdd, and BL are formed on the frontside of the substrate, as illustrated in FIG. 9B. It is noted that some metal lines (such as 714B and 714D) not directly cut through the line AA' are illustrated in dashed lines in FIG. 9B. The metal lines formed on the backside are all illustrated in dashed lines in both FIGS. 9A and 9B. The second cell 104B also includes metal line 714D2 and corresponding contact feature for WL, formed on the frontside of the substrate.

Figure 9C:
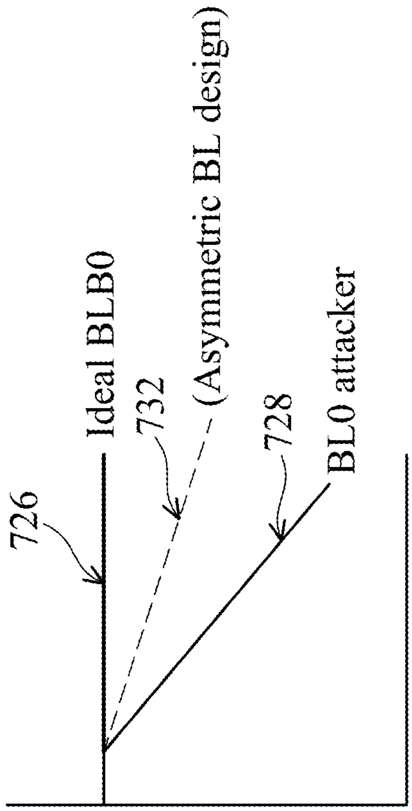
FIGS. 9C and 9D are graphic views to illustrate the characteristics of the integrated circuit structure of FIGS. 9A and 9B, constructed in accordance with some embodiments.
Figure 9D:
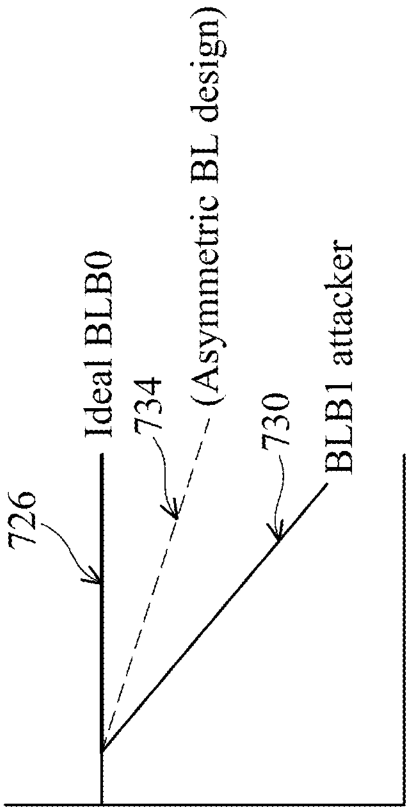

FIGS. 9C and 9D are graphic views of the characteristics of the integrated circuit structure 100, such as one of FIGS.

9A and 9B, according to some embodiments. In FIGS. 9C and 9D, "BL0" stands for the corresponding contact feature underlying and electrically connected to the BL in the first metal layer if the BL is formed on the frontside. Similarly, "BLB0" stands for the corresponding contact feature underlying and electrically connected to the BLB in the first metal layer if the BLB is formed on the frontside; and "BLB1" stands for the corresponding BLB if the BLB is formed in the first metal layer on the frontside or formed on the backside. The vertical axis stands for the signal, such as voltage, while the horizontal axis stands for the signal over the path (such as the signal over the path from the top to the bottom of the corresponding contact feature in one example). Ideally, the signal is expected to be maintained at the same level without loss. For example, the signal 726 represents the ideal signal of BLB without loss as illustrated in FIGS. 9C and 9D. In FIG. 9C, "BL0 attacker" 728 represents the signal of the BLB0 under the impact of the BL0 due to the coupling between BL0 and BLB0, in which both BL and BLB are formed on the frontside. In FIG. 9D, "BLB1 attacker" 730 represents the signal of the BLB0 under the impact of the BLB1 due to the additional resistance added into the BLB signal line, in which both BL and BLB are formed on the frontside. FIGS. 9C and 9D show that the signal of BLB0 is dramatically degraded by BL0 attacker or BLB1 attacker. In the contrary, when the disclosed structure 100 with asymmetric bit-line design, the corresponding signal of the BLB0 is closer to the ideal signal with reduced loss from the BL0 attacker, such as 732 illustrated in FIG. 9C or with reduced loss from the BLB1 attacker, such as 734 illustrated in FIG. 9D. It is noted that after the redistribution of various conductive features between the frontside and backside of the integrated circuit structure 100, the conductive features, such as contact features, via features and metal lines are tuned for optimized spacings and dimensions.

The disclosed asymmetric layout of the SRAM bit cells 104 has various considerations and advantages. For example, the bit lines have reduced resistance due to increased metal sizes; BL and BLB coupling effect is reduced since those are asymmetrically distributed on the frontside and backside and are distanced far away; and the parasitic capacitances among BL, BLB, Vdd, Vss and butted contact features 620 (labeled as "BCT' in FIGS. 9A and 9B) are configured with greater spacing.

Figure 10A:
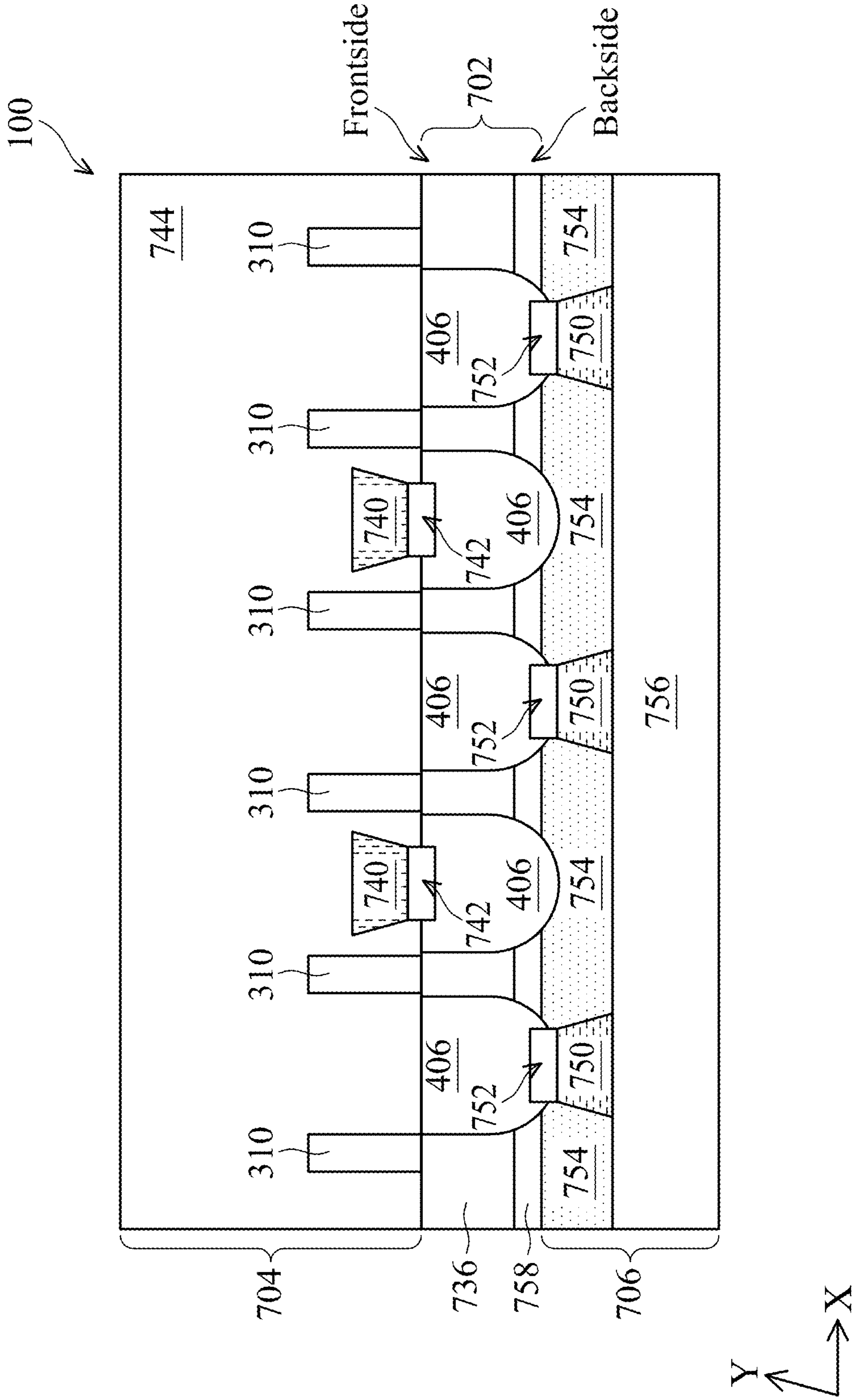
FIG. 10A is a sectional view of the integrated circuit structure, constructed in accordance with some embodiments.
Figure 10B:
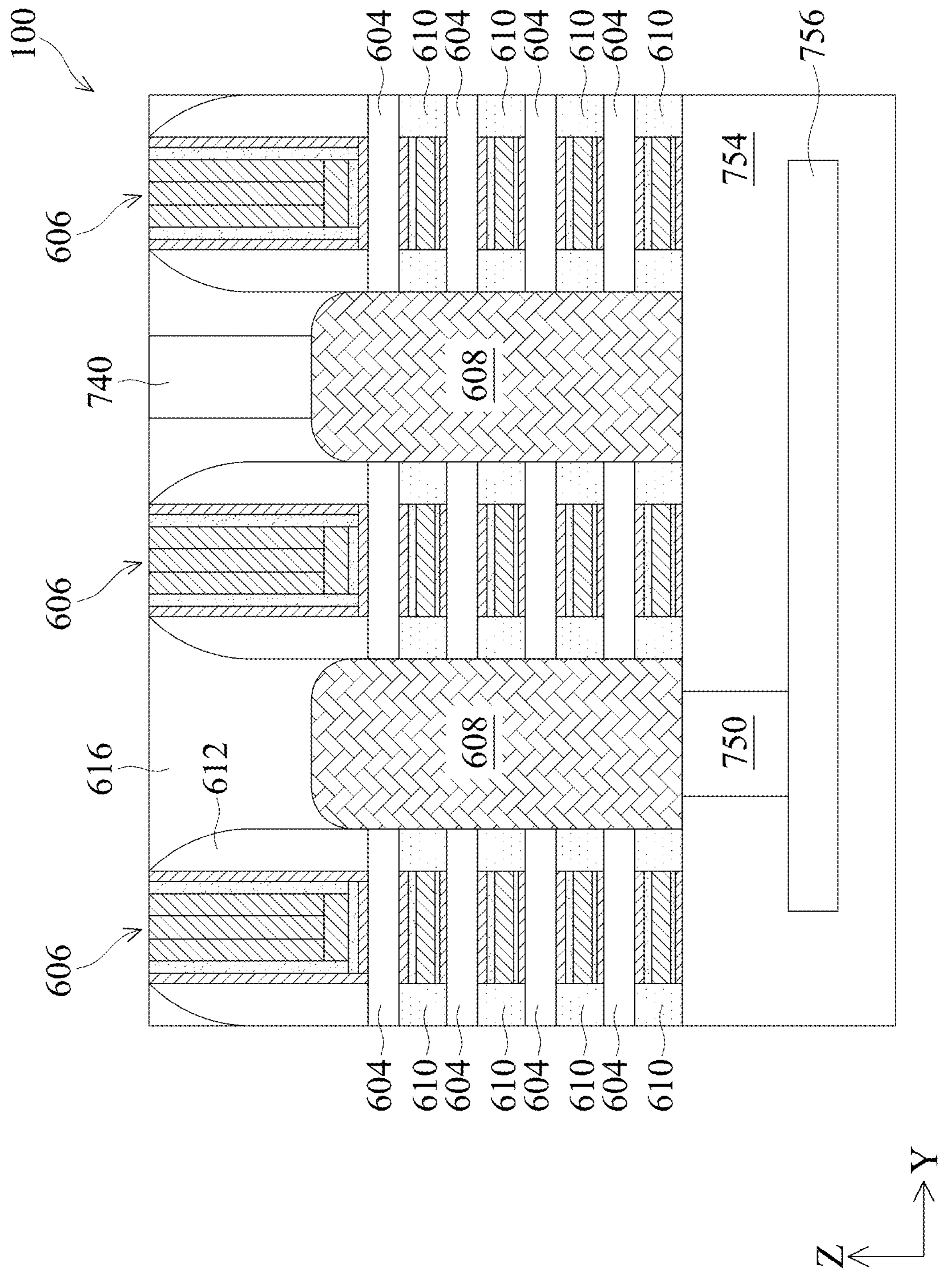
FIG. 10B is a sectional view of the integrated circuit structure, constructed in accordance with some embodiments.

The frontside interconnect structure may be formed by any suitable method, such as damascene process, dual damascene process, or a process used to form aluminum interconnection. The process used to form aluminum interconnection includes metal deposition, metal patterning, and ILD deposition (may further include CMP). The backside interconnect structure is formed similarly. For example, the backside metal lines and corresponding contacts and vias may be formed by damascene process, dual damascene process, or the process used to form aluminum interconnection. Those interconnect structure are further illustrated in FIGS. 10A and 10B. FIGS. 10A and 10B are sectional views of the integrated circuit structure 100 constructed in accordance with various embodiments.

In FIG. 10A, the integrated circuit structure 100 includes a substrate 702 with various devices formed thereon, a frontside interconnect structure 704, and a backside interconnect structure 706. The substrate 702 includes an active region 736, source/drain features 406, and gate stacks 310 configured to form various FETs, such as pull-up devices, pull-down devices, and pass-gate devices of the SRAM bit cells 104. The frontside interconnect structure 704 includes frontside contact features 740 formed on the frontside ILD layer 744, vias and metal lines disposed the frontside and configured to connect gate stacks 310 and some source/drain features 406. Only frontside contact features 740 are provided for illustration. The frontside contact features 740 may further include silicide features 742 formed on the source/drain features 406 to reduce contact resistance. The frontside contact features 740 are landing on the frontside surface of the source/drain features 406.

The backside interconnect structure 706 includes backside contact features 750 formed on the backside ILD layer 754, metal lines 756, and vias (may further include metal lines on other metal layers) disposed the backside and configured to connect some source/drain features 406 (and may include some gate stacks 310). Only backside contact features 750 and the metal lines 756 are provided for illustration. The backside contact features 750 may further include silicide features 752 formed on the source/drain features 406 to reduce contact resistance. The backside contact features 750 are landing on the backside surface of the source/drain features 406. The metal lines 756 are landing on the backside contact features 750 and are also referred to as backside power rails. For examples, the metal lines 756 may include the metal lines 722A, 722B, 714C2, and 714B2 of FIG. 9B. The backside contact features 750 are landing on the backside surface of the source/drain features 406. The integrated circuit structure 100 may include other features, such as a dielectric layer 758 for isolation.

The method to form the integrated circuit structure 100 may include front-end of line (FEOL) process to form gate stacks and source/drain features; middle-end of line (MEOL) process to form frontside contacts; back-end of line (BEOL) process to form metal lines and vias of the frontside interconnect structure 704 and passivation. The method further includes bonding a substrate to the frontside, thinning down the substrate from the backside, forming the backside contact features 750, the backside metal lines 756, and so on.

The integrated circuit structure 100 may be formed on a structure having vertically-stacked multiple channels, such as one illustrated in FIG. 10B. In FIG. 10B, a frontside contact feature 740 is formed on one source/drain feature 608 and a backside contact feature 750 is formed on another source/drain feature 608 and a backside metal line 756 is connected to the backside contact feature 750.

In the disclosed integrated circuit structure 100, various metal lines include metal material, such as copper (Cu), aluminum (Al), tungsten (W), ruthenium (Ru), cobalt (Co), molybdenum (Mo), or a combination thereof; and may further include a barrier layer such as titanium and titanium nitride (Ti/TiN), or tantalum and tantalum nitride (Ta/TaN). In some examples, the barrier layer may use Ru.

In some embodiments, the SRAM bit cells 104 may be constructed a different asymmetric layout to achieve similar advantages. Some embodiments are further described below.

Figure 11A:
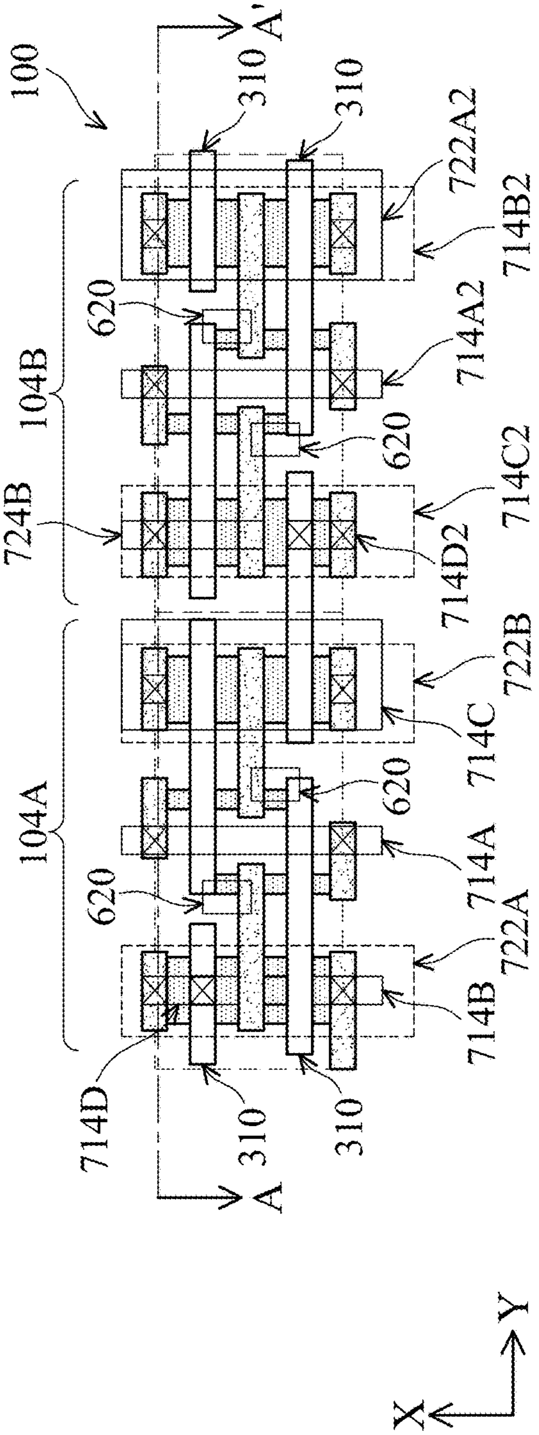
FIG. 11A is a top view of the integrated circuit structure having two adjacent SRAM bit cells, constructed in accordance with some embodiments.
Figure 11B:
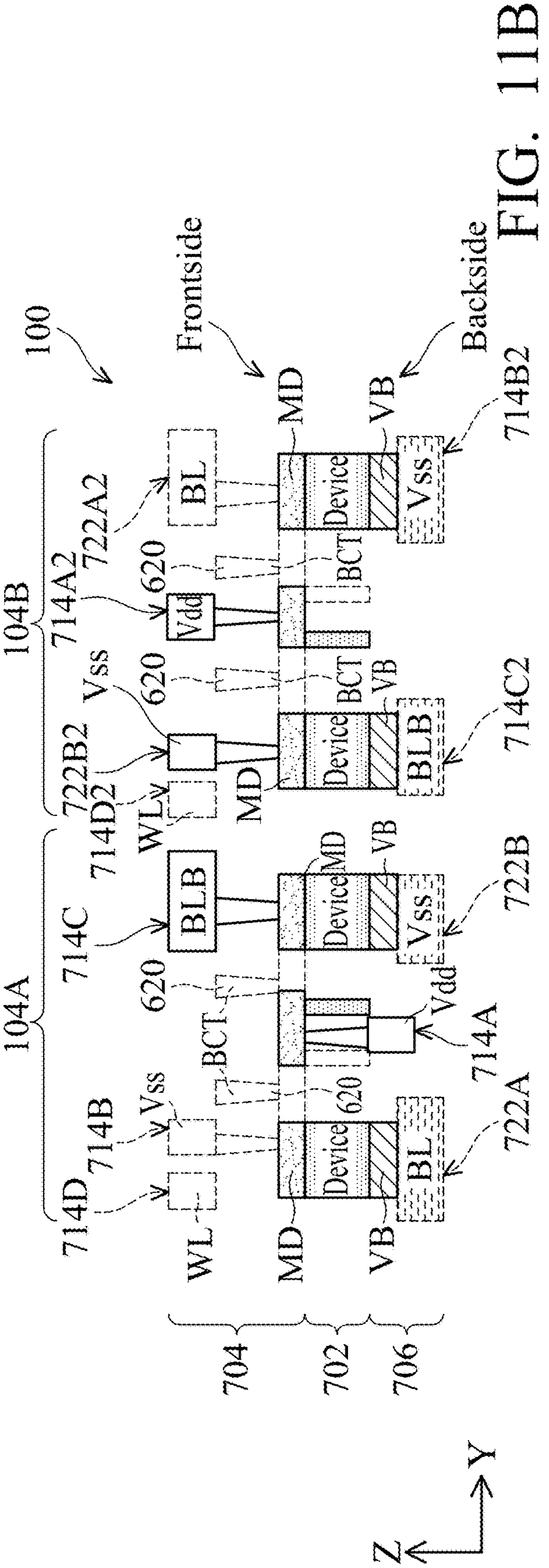
FIG. 11B is a sectional view of the integrated circuit structure of FIG. 11A along the dashed line AA', constructed in accordance with some embodiment

FIG. 11A is a top view of the integrated circuit structure 100 and FIG. 11B is a sectional view of the integrated circuit structure 100 along the dashed line AA' of FIG. 11A, constructed in accordance with some embodiments. Some features are not shown in FIG. 11B for better view. Additional cells may be configured in cascade with similar asymmetric configuration. Especially, the power lines Vdd for adjacent SRAM cells are also designed asymmetrically, such as Vdd in one cell is formed on the frontside and Vdd in an adjacent cell is backside of the substrate.

In the depicted embodiment illustrated in FIGS. 11A and 11B, the integrated circuit structure 100 includes two SRAM bit cells 104A and 104B. Each cell includes power lines (Vss and Vdd) and bit lines (BL and BLB). Especially, the first cell 104A includes metal lines 714A, 722A, and 722B and corresponding contact features for Vdd, BL and Vss (associated with PD-2), respectively, and those are formed on the backside. The first cell 104A also includes metal lines (714B and 714C) and corresponding contact features for Vss (associated with PD-1) and BLB, respectively, and those are formed on the frontside of the substrate. The first cell 104A also includes metal line 714D and corresponding contact feature for WL, formed on the frontside of the substrate.

The second cell 104B is designed asymmetrically in various ways including metal lines distribution between the backside and the frontside; and metal line locations, sizes and shapes. The second cell 104B includes metal lines 714C2 and 714B2 and corresponding contact features for the BLB and Vss (associated with PD-1) and the metal lines 722A2, 722B2, and 714A2 and corresponding contact features for the BL, Vss (associated with PD-2), and Vdd. However, the metal lines 714C2 and 714B2 for BLB and Vss (associated with PD-1 device) are formed on the backside while the metal lines 722B2, 714A2 and 722A2 for Vss (associated with PD-2 device), Vdd, and BL are formed on the frontside of the substrate, as illustrated in FIG. 11B. It is noted that some metal lines (such as 714B and 714D) not directly cut through the line AA' are illustrated in dashed lines in FIG. 11B. The metal lines formed on the backside are all illustrated in dashed lines in both FIGS. 11A and 11B. The second cell 104B also includes metal line 714D2 and corresponding contact feature for WL, formed on the frontside of the substrate.

Figure 12A:
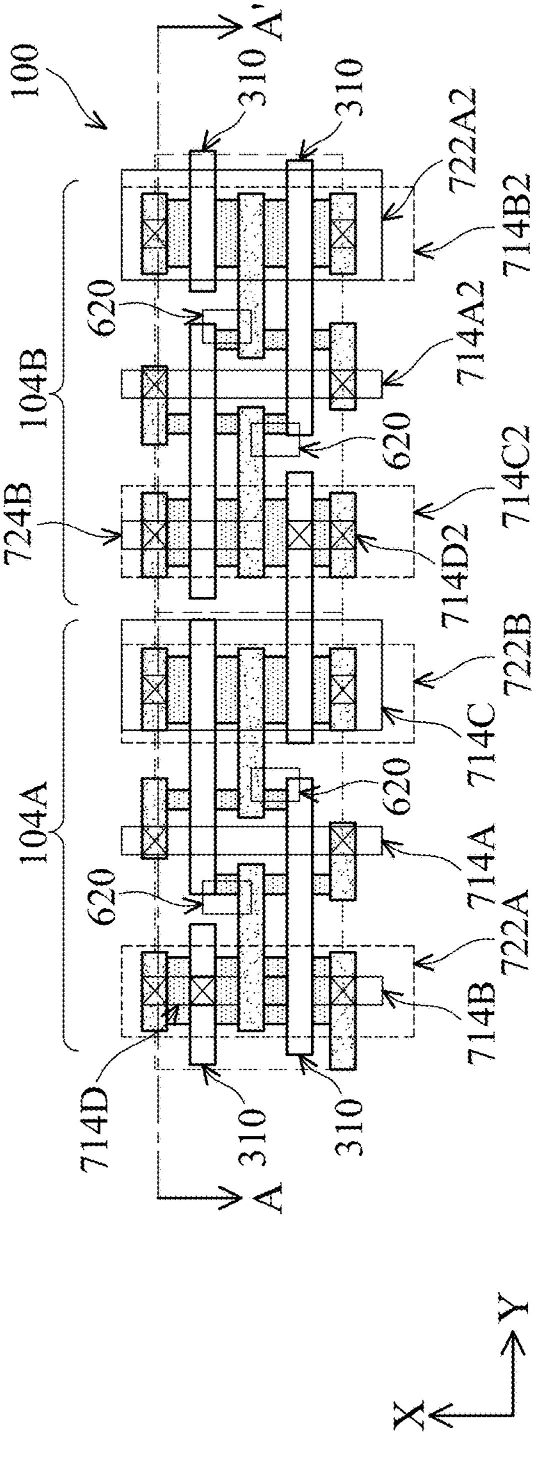
FIG. 12A is a top view of the integrated circuit structure having two adjacent SRAM bit cells, constructed in accordance with some embodiments.
Figure 12B:
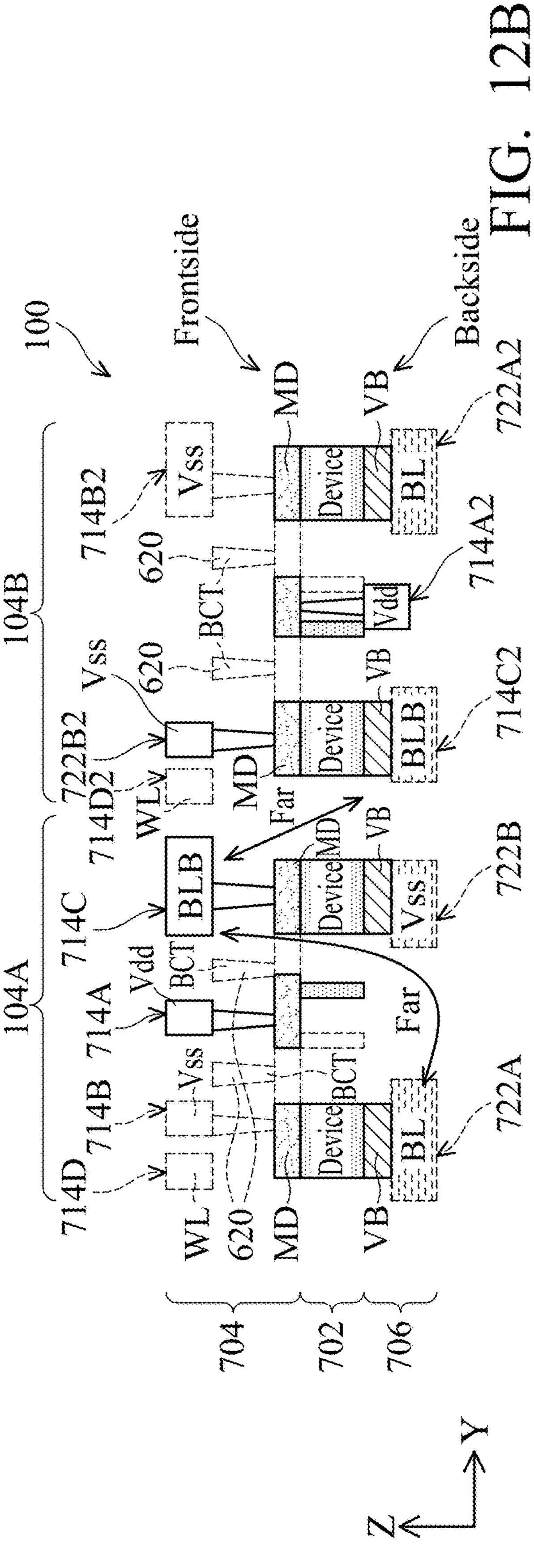
FIG. 12B is a sectional view of the integrated circuit structure of FIG. 12A along the dashed line AA', constructed in accordance with some embodiment

FIG. 12A is a top view of the integrated circuit structure 100 and FIG. 12B is a sectional view of the integrated circuit structure 100 along the dashed line AA' of FIG. 11A, constructed in accordance with some embodiments. Some features are not shown in FIG. 12B for better view. Additional cells may be configured in cascade with similar asymmetric configuration. Especially, the power lines Vdd for adjacent SRAM cells are also designed asymmetrically, such as Vdd in one cell is formed on the frontside and Vdd in an adjacent cell is backside of the substrate.

In the depicted embodiment illustrated in FIGS. 12A and 12B, the integrated circuit structure 100 includes two SRAM bit cells 104A and 104B. Each cell includes power lines (Vss and Vdd) and bit lines (BL and BLB). Especially, the first cell 104A includes metal lines 722A, and 722B and corresponding contact features for BL and Vss (associated with PD-2), respectively, and those are formed on the backside. The first cell 104A also includes metal lines 714A, 714B and 714C and corresponding contact features for Vdd, Vss (associated with PD-1) and BLB, respectively, and those are formed on the frontside of the substrate. The first cell 104A also includes metal line 714D and corresponding contact feature for WL, formed on the frontside of the substrate.

The second cell 104B is designed asymmetrically in various ways including metal lines distribution between the backside and the frontside; and metal line locations, sizes and shapes. The second cell 104B includes metal lines (722B2 and 714B2) and corresponding contact features for Vss (associated with PD-2) and Vss (associated with PD-1) and the metal lines (714C2, 714A2 and 722A2) and corresponding contact features for the BLB, Vdd and BL. However, the metal lines 714C2, 714A2 and 722A2 for BLB, Vdd and BL are formed on the backside while the metal lines 722B2 and 714B2 for Vss (associated with PD-2 device) and Vss (associated with PD-1 device) are formed on the frontside of the substrate, as illustrated in FIG. 12B. It is noted that some metal lines (such as 714B and 714D) not directly cut through the line AA' are illustrated in dashed lines in FIG. 12B. The metal lines formed on the backside are all illustrated in dashed lines in both FIGS. 12A and 12B. The second cell 104B also includes metal line 714D2 and corresponding contact feature for WL, formed on the frontside of the substrate.

Figure 13A:
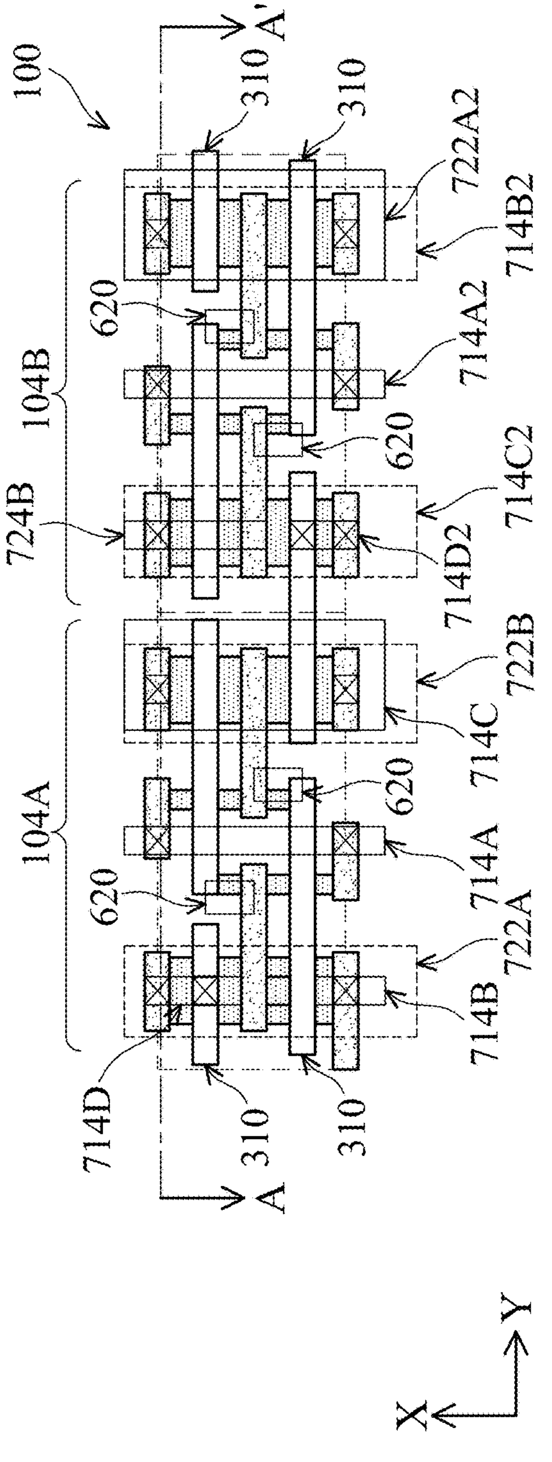
FIG. 13A is a top view of the integrated circuit structure having two adjacent SRAM bit cells, constructed in accordance with some embodiments.
Figure 13B:
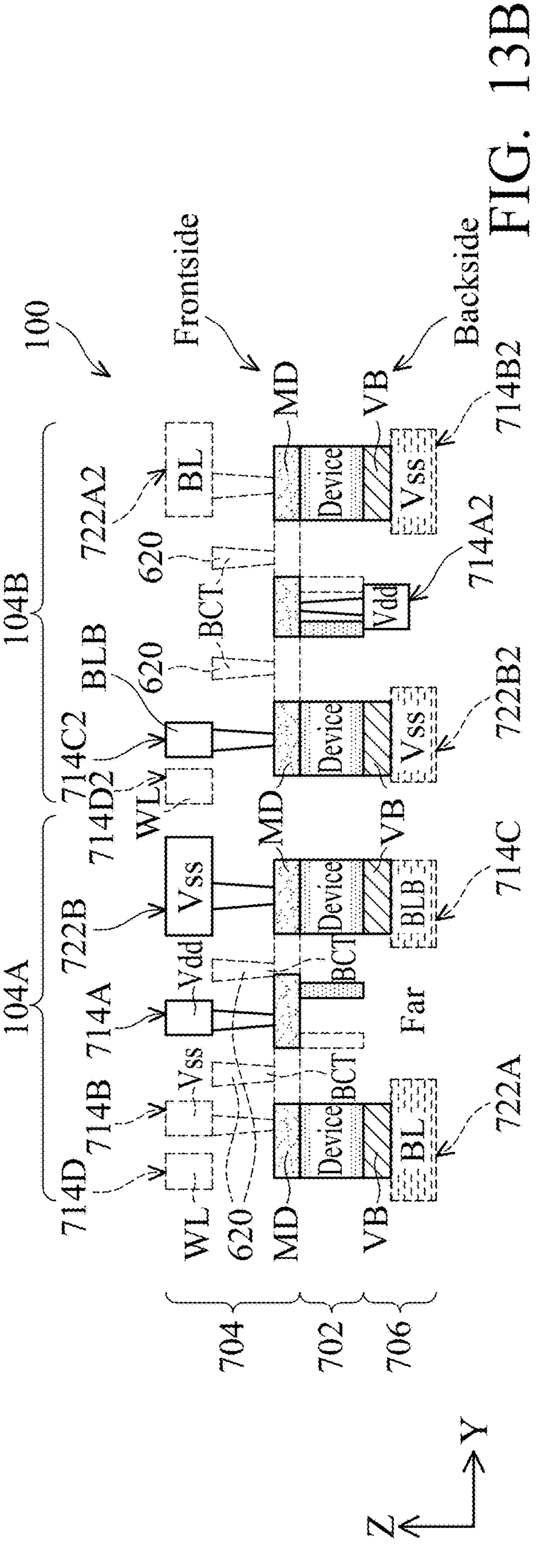
FIG. 13B is a sectional view of the integrated circuit structure of FIG. 13A along the dashed line AA', constructed in accordance with some embodiment.

FIG. 13A is a top view of the integrated circuit structure 100 and FIG. 13B is a sectional view of the integrated circuit structure 100 along the dashed line AA' of FIG. 13A, constructed in accordance with some embodiments. Some features are not shown in FIG. 13B for better view. Additional cells may be configured in cascade with similar asymmetric configuration. Especially, the power lines Vdd for adjacent SRAM cells are also designed asymmetrically, such as Vdd in one cell is formed on the frontside and Vdd in an adjacent cell is backside of the substrate.

In the depicted embodiment illustrated in FIGS. 13A and 13B, the integrated circuit structure 100 includes two SRAM bit cells 104A and 104B. Each cell includes power lines (Vss and Vdd) and bit lines (BL and BLB). Especially, the first cell 104A includes metal lines 722A and 714C and corresponding contact features for BL and BLB, respectively, and those are formed on the backside. The first cell 104A also includes metal lines 714B, 714A and 722B and corresponding contact features for Vss (associated with PD-1), Vdd and Vss (associated with PD-2), respectively, and those are formed on the frontside of the substrate. The first cell 104A also includes metal line 714D and corresponding contact feature for WL, formed on the frontside of the substrate.

The second cell 104B is designed asymmetrically in various ways including metal lines distribution between the backside and the frontside; and metal line locations, sizes and shapes. The second cell 104B includes metal lines 722A2 and 722B2 and corresponding contact features for the BL and Vss (associated with PD-2) and the metal lines 714C2, 714B2, and 714A2 and corresponding contact features for the BLB, Vss (associated with PD-1), and Vdd. However, the metal lines 722B2, 714A2 and 714B2 for Vss (associated PD-2 device), Vdd and Vss (associated with PD-1 device) are formed on the backside while the metal lines 714C2 and 722A2 for BLB and BL are formed on the frontside of the substrate, as illustrated in FIG. 13B. It is noted that some metal lines (such as 714B and 714D) not directly cut through the line AA' are illustrated in dashed lines in FIG. 13B. The metal lines formed on the backside are all illustrated in dashed lines in both FIGS. 13A and 13B. The second cell 104B also includes metal line 714D2 and corresponding contact feature for WL, formed on the frontside of the substrate.

Other asymmetric layouts are contemplated by the present disclosure. A method of generating an integrated circuit structure having SRAM cells with an asymmetric layout (such as those illustrated in FIGS. 9A-9B, 11A-11B, 12A-12B and 13A-13B) is provided below in detail. FIG. 14 is a flowchart of a method 800 constructed according to some embodiments.

At block 802 of the method 800, a layout of an integrated circuit having a plurality of SRAM cells is received as an initial layout. In the initial layout, various bit-lines (BL and BLB), word-lines (WL and WLB), and power lines (Vss and Vdd) are configured on the frontside of substrate. At block 804, contact features associated with various bit-lines (BL and BLB), word-lines (WL and WLB), and power lines (Vss and Vdd) are identified in each SRAM cell. At block 806, the identified contact features in a SRAM cell are classified into two groups: a first group and a second group according to relevant parameters (such as contact resistance, and RC constant) and design rules (such as contact spacing, shielding effect, RC constant and other relevant factors, such as further described below in detail. At block 808, the layout of the SRAM cell in the integrated circuit is modified such that the first group of contacts and corresponding conductive features (i.e., via features and metal lines) are configured on the frontside of the substrate and the first group of contacts and corresponding conductive features are configured on the frontside of the substrate. At block 810, this process is an iterative process according to various factors (such as those described above) until the layout in the SRAM cell optimized. Block 810 also repeat such process for other SRAM cells. For example, after a first SRAM cell is processed, an adjacent SRAM cell is processed similarly, especially, the adjacent SRAM cell is processed according to the same factors and additionally the effect of the interaction between the adjacent SRAM cells according to the same factors to achieve an asymmetric layout. Particularly, those factors are evaluated for the first SRAM cell in the intercell, and those factors are evaluated for the second (adjacent) SRAM cell both in intercell and intracell. For example, the first SRAM cell has the complementary bit-line BLB configured on the backside while the second SRAM cell has the complementary bit-line BLB configured on the frontside according intercell effect and intracell effect since BLBs in the first and second cell are further distanced to reduce the cross-talk. When the process continues to other SRAM cells, it may have multiple adjacent cells and needs to consider intracell effects to multiple adjacent cells. The method 800 may also include a block 812, in which the integrated circuit is fabricated according to the modified layout. For example, various photomasks are made according to the modified layout and integrated circuits are fabricated on semiconductor substrates using the photomasks.

Referring back to block 806 to classify the contacts into the first and second groups, various factors are considered. Those factors may be evaluated sequentially according to impact significance of those factors. In one embodiment illustrated in FIG. 14, various factors are considered sequentially according to factors at blocks 820 through 826. At block 820, the design rule, such as contact spacing, is first considered. Those contacts having too narrow spacings or in violation with design rule are considered to classified to different groups (such as one in the first group and another in the second group). Thus, contact spacing can be increased, the contact size can also be increased, and contact resistance can be reduced.

At block 822, the shielding effect or crosstalk is considered. The crosstalk refers to undesired signal transfer between single lines. For example, the bit-line BL and the complementary bit-line BLB may carry different signals and interaction between these two signal lines are undesired. In this case, BL and BLB are classified to different group. At present step, when BL and BLB distributed to different group can also substantially reduce the contact spacing, instead of redistributing other two contact features (such as Vss and Vdd), BL and BLB are redistributed to the backside and the frontside, respectively.

At block 824, a parasitic capacitance and RC constant are considered. The parasitic capacitance between conductive features impact RC constant and the circuit speed. Circuit speed is evaluated at this step. The grouping may be further adjusted according to the circuit speed requirements. For example, if a grouping strategy can substantially improve the circuit speed or effectively tune a local speed according the circuit specification without substantially impacting other factors (such as contact spacing and shielding effect), the layout is modified accordingly.

At block 826, the voltage levels of power lines may be considered as one effect to form the two groups for redistribution on the frontside and backside of the substrate. When the grouping still has freedom for further adjustment, power lines with different voltage levels can be a factor for further tuning to grouping. For example, Vss and Vdd in a same cell or in adjacent cells may be classified to different groups. Accordingly, high voltage power line (Vdd) and low (grounding) power line (Vss) interaction can be reduced.

The method 800 is described above according to some embodiments. However, these factors may be evaluated in a different sequence (such as shielding effect, then contact spacing, RC constant and power lines) or some factors may be collectively evaluated (such as parasitic capacitance and contact spacing). Other factors may be alternatively or additionally considered. For example, shared word-lines or overlay shift. In furtherance of the example, some contact features or corresponding conductive features are fabricated using different photomasks, the overlay shift is an additional factor to be evaluated according to the overlay shift margin.

The present disclosure provides various embodiments of an integrated circuit structure having SRAM array with asymmetric configuration and connection. A subset of BL, BLB, Vss and Vdd are formed on the frontside and another subset of BL, BLB, Vss and Vdd are formed on the backside of the substrate. In some embodiments, the adjacent SRAM bit cells are configured asymmetrically to enhance circuit performance, such as induced parasitic capacitance, reduced resistance and reduced coupling among metal lines BL, BLB, Vss and Vdd.

The present disclosure provides a semiconductor structure and a method of making the same. In one aspect, the present disclosure provides a semiconductor structure. The semiconductor structure includes a substrate having a frontside and a backside; a static random-access memory (SRAM) circuit having SRAM bit cells formed on the frontside of the substrate, wherein each of the SRAM bit cells including two inverters cross-coupled together, and a first and second pass gates coupled to the two inverters; a first bit-line disposed on the frontside of the substrate and connected to the first pass gate; and a second bit-line disposed on the backside of the substrate and connected to the second pass gate.

In another aspect of the present disclosure pertains to a semiconductor structure, the semiconductor structure includes a substrate having a frontside and a backside; a static random-access memory (SRAM) circuit having SRAM bit cells formed on the frontside of the substrate, wherein each of the SRAM bit cells including two inverters cross-coupled together, and a first and second pass gates coupled to the two inverters; a first cell of the SRAM bit cells that includes a bit-line disposed on the frontside of the substrate and connected to the first pass gate, and a complementary bit-line disposed on the backside of the substrate and connected to the second pass gate; and a second cell of the SRAM bit cells that includes a bit-line disposed on the backside of the substrate and connected to the first pass gate of the second cell, and a complementary bit-line disposed on the frontside of the substrate and connected to the second pass gate of the second cell.

In yet another aspect of the present disclosure pertains to a method of semiconductor fabrication, the method includes receiving an integrated circuit (IC) layout having a plurality of static-random-access memory (SRAM) cells; identifying contact features of power lines and signal lines in the SRAM cells; classifying the contact features into a first group and a second group; and modifying the IC layout such that the first group of the contact features are configured on a frontside of a substrate and the second group of the contact features are configured on a backside of the substrate with an asymmetric structure.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:

a substrate having a frontside over the substrate and a backside under the substrate;

a static random-access memory (SRAM) circuit having SRAM bit cells formed on the frontside of the substrate, wherein a first one of the SRAM bit cells includes:

a first and a second inverter cross-coupled together, the first inverter having a first pull-up device and a first pull-down device, and the second inverter having a second pull-up device and a second pull-down device, and a first pass-gate coupled to the first inverter and a second pass-gate coupled to the second inverter;

a first bit-line connected to the first pass-gate;

a first bit-line bar connected to the second pass-gate;

ground lines disposed on the frontside of the substrate; and a first power line connected to source features of the first and second pull-up devices, wherein the first bit-line and the first bit-line bar are disposed on the backside of the substrate, wherein the power line is disposed on the frontside of the substrate, and wherein the ground lines are electrically connected to ground, and the power line is electrically connected to a voltage source.

2. The semiconductor structure of claim 1, wherein the ground lines include a first ground line connected to the first pull-down device and a second ground line connected to the second pull-down device.

3. The semiconductor structure of claim 1, wherein a second one of the SRAM bit cells includes:

a third and a fourth inverter cross-coupled together, the third inverter having a third pull-up device and a third pull-down device, and the fourth inverter having a fourth pull-up device and a fourth pull-down device;

a third pass-gate coupled to the third inverter and a fourth pass-gate coupled to the fourth inverter;

a second bit-line connected to the third pass-gate; and a second bit-line bar connected to the fourth pass-gate, wherein the second bit-line and the second bit-line bar are disposed on the frontside of the substrate.

4. The semiconductor structure of claim 3, wherein the second one of the SRAM bit cells includes a second power line connected to source features of the third and fourth pull-up devices, wherein the second power line is disposed on the backside of the substrate.

5. The semiconductor structure of claim 4, further comprising a third ground line connected to the third pull-down device; and a fourth ground line connected to the fourth pull-down device, wherein the third and fourth ground lines are disposed on the backside of the substrate.

6. The semiconductor structure of claim 5, wherein the third and fourth ground lines are electrically connected to ground, and the second power line is electrically connected to a voltage source.

7. The semiconductor structure of claim 3, further comprising:

a first backside contact feature landing on a bottom surface of a source/drain feature of the first pass-gate; and a first frontside contact feature landing on a top surface of a source/drain feature of the third pass-gate.

8. A semiconductor structure, comprising:

a substrate having a frontside over the substrate and a backside under the substrate;

a static random-access memory (SRAM) circuit having SRAM bit cells formed on the frontside of the substrate, wherein a first one of the SRAM bit cells includes:

a first and a second inverter cross-coupled together, the first inverter having a first pull-up device and a first pull-down device, and the second inverter having a second pull-up device and a second pull-down device, and a first pass-gate coupled to the first inverter and a second pass-gate coupled to the second inverter;

a first ground line disposed on the frontside of the substrate and connected to a first type field-effect transistor (FET) of the two inverters;

a second ground line disposed on the backside of the substrate and connected to a second type FET of the two inverters; and a power line connected to source features of the first and second pull-up devices, wherein the power line is disposed on the frontside of the substrate.

9. The semiconductor structure of claim 8, further comprising a bit-line connected to the first pass-gate; and a bit-line bar connected to the second pass-gate, wherein the bit-line and the bit-line bar are disposed on opposite sides of the substrate.

10. The semiconductor structure of claim 9, wherein a second one of the SRAM bit cells includes:

a third and a fourth inverter cross-coupled together, the third inverter having a third pull-up device and a third pull-down device, and the fourth inverter having a fourth pull-up device and a fourth pull-down device, and a third pass-gate coupled to the third inverter and a fourth pass-gate coupled to the fourth inverter, further comprising:

a second bit-line connected to the third pass-gate;

a second bit-line bar connected to the fourth pass-gate, wherein the second bit-line and the second bit-line bar are disposed on the backside of the substrate; and a second power line connected to source features of the third and fourth pull-up devices, wherein the second power line is disposed on the backside of the substrate.

11. The semiconductor structure of claim 10, wherein the second bit-line and the second bit-line bar are disposed the backside of the substrate.

12. A semiconductor structure, comprising:

a substrate having a frontside and a backside;

a static random-access memory (SRAM) circuit having SRAM bit cells formed on the frontside of the substrate, wherein a first one of the SRAM bit cells including two inverters cross-coupled together, and a first and second pass-gates coupled to the two inverters;

a first power line disposed on the frontside of the substrate and connected to a first type field-effect transistor (FET) of the two inverters;

a second power line disposed on the backside of the substrate and connected to a second type FET of the two inverters; and a first word line disposed on the backside of the substrate.

13. The semiconductor structure of claim 12, wherein the first power line is a higher power line Vdd and the first type FET is a p-type FET (pFET);

the second power line is a lower power line Vss and the second type FET is a n-type FET (nFET); and the semiconductor structure further includes a third power line disposed on the frontside of the substrate and connected to another nFET of the two inverters.

14. The semiconductor structure of claim 12, further comprising:

a first bit-line disposed on the frontside of the substrate and connected to the first pass-gate of the first one of the SRAM bit cells; and a second bit-line disposed on the backside of the substrate and connected to the second pass-gate of the first one of the SRAM bit cells.

15. The semiconductor structure of claim 12, wherein a second one of the SRAM bit cells is adjacent the first one of the SRAM bit cells;

a first bit-line of the second one of the SRAM bit cells is disposed on the frontside of the substrate and connected to a first pass-gate of the second one of the SRAM bit cells; and a second bit-line of the second one of the SRAM bit cells is disposed on the backside of the substrate and connected to a second pass-gate of the second one of the SRAM bit cells.

16. The semiconductor structure of claim 12, further comprising:

a frontside contact feature landing on a top surface of a source/drain feature of the first pass-gate; and a backside contact feature landing on a bottom surface of a source/drain feature of the second pass-gate, wherein the first power line is connected to the first pass-gate through the frontside contact feature, and the second power line is connected to the second pass-gate through the backside contact feature.

17. The semiconductor structure of claim 12, further comprising:

a frontside contact feature landing on a top surface of a source/drain feature of the first pass-gate; and a backside contact feature landing on a bottom surface of a source/drain feature of the second pass-gate.

18. The semiconductor structure of claim 17, wherein the frontside contact feature further includes a first silicide feature disposed on the top surface of the source/drain feature of the first pass-gate; and the backside contact feature further includes a second silicide feature disposed on the bottom surface of the source/drain feature of the second pass-gate.

19. The semiconductor structure of claim 12, further comprising:

a second word line disposed on the frontside of the substrate, wherein the first word line is connected to a gate electrode of the second pass-gate, and wherein the second word line is connected to a gate electrode of the first pass-gate.

20. The semiconductor structure of claim 1, wherein the ground lines include a first ground line opposing the first bit-line along a vertical direction and a second ground line opposing the first bit-line bar along the vertical direction.

* * * * *